US012683563B2

(12) United States Patent　　　　　(10) Patent No.: US 12,683,563 B2
Khesbak et al.　　　　　　　　　　　(45) Date of Patent: Jul. 14, 2026

(54) ENVELOPE TRACKING WITH ADJUSTABLE SLEW RATE

(71) Applicant: Skyworks Solutions, Inc., Irvine, CA (US)

(72) Inventors: Sabah Khesbak, Irvine, CA (US); Roman Zbigniew Arkiszewski, Oak Ridge, NC (US); Jeffrey Gordon Strahler, Greensboro, NC (US); Florinel G. Balteanu, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 657 days.

(21) Appl. No.: 17/894,005

(22) Filed: Aug. 23, 2022

(65) Prior Publication Data

US 2023/0065303 A1　　Mar. 2, 2023

Related U.S. Application Data

(60) Provisional application No. 63/236,502, filed on Aug. 24, 2021, provisional application No. 63/236,520, (Continued)

(51) Int. Cl.
*H03F 3/04*　　　　(2006.01)
*H02M 3/07*　　　　(2006.01)
(Continued)

(52) U.S. Cl.
CPC ............ *H03F 3/245* (2013.01); *H02M 3/078* (2021.05); *H02M 3/1584* (2013.01); (Continued)

(58) Field of Classification Search
CPC .......... H03F 3/245; H03F 1/0227; H03F 3/21; H03F 2200/102; H03F 2200/451; H03F 2201/3224; H03F 1/0238; H03F 1/3247; H03F 3/04; H03F 1/0244; H03F 1/0211; H03F 2200/504; H02M 3/078; H02M 3/1584; H04B 1/3827; H03G 3/3042; H03G 3/004
(Continued)

(56) References Cited

U.S. PATENT DOCUMENTS 6,438,365 B1　　8/2002　Balteanu
6,529,716 B1　　3/2003　Eidson et al.
(Continued)

OTHER PUBLICATIONS

Diaz et al., "Three-Level Cell Topology for a Multilevel Power Supply to Achieve high Efficiency Envelope Amplifier," IEEE Transactions on Circuits and Systems-I: Regular Papers, vol. 59, No. 9, Sep. 2012, in 14 pages.
(Continued)

*Primary Examiner* — Khanh V Nguyen
(74) *Attorney, Agent, or Firm* — VIA LLP

(57) ABSTRACT

Apparatus and methods for power amplifier envelope tracking systems with automatic control of a slew rate and a mode of an error amplifier of the envelope tracking system. The envelope tracker can include a signal bandwidth detection circuit that processes the envelope signal to generate a detected bandwidth signal, and a control circuit that controls the slew rate of the error amplifier based on the detected signal bandwidth.

19 Claims, 16 Drawing Sheets

Related U.S. Application Data filed on Aug. 24, 2021, provisional application No. 63/236,524, filed on Aug. 24, 2021.

(51) Int. Cl.

| | |
|---|---|
| *H02M 3/158* | (2006.01) |
| *H03F 1/02* | (2006.01) |
| *H03F 3/21* | (2006.01) |
| *H03F 3/24* | (2006.01) |
| *H04B 1/3827* | (2015.01) |

(52) U.S. Cl.
CPC ............ *H03F 1/0227* (2013.01); *H03F 3/21* (2013.01); *H04B 1/3827* (2013.01); *H03F 2200/102* (2013.01); *H03F 2200/451* (2013.01)

(58) Field of Classification Search
USPC ................................................. 330/127, 297
See application file for complete search history.

(56) References Cited

U.S. PATENT DOCUMENTS

| | | | |
|---|---|---|---|
| 6,681,101 | B1 | 1/2004 | Eidson et al. |
| 6,704,560 | B1 | 3/2004 | Balteanu et al. |
| 6,952,567 | B2 | 10/2005 | Sowlati |
| 6,977,976 | B1 | 12/2005 | Birkett et al. |
| 7,277,678 | B2 | 10/2007 | Rozenblit et al. |
| 7,496,339 | B2 | 2/2009 | Balteanu et al. |
| 8,140,028 | B2 | 3/2012 | Balteanu et al. |
| 8,351,873 | B2 | 1/2013 | Balteanu et al. |
| 8,718,188 | B2 | 5/2014 | Balteanu et al. |
| 8,786,371 | B2 | 7/2014 | Popplewell et al. |
| 8,797,103 | B2 | 8/2014 | Kaczman et al. |
| 8,874,051 | B2 | 10/2014 | Rozenblit et al. |
| 8,981,847 | B2 | 3/2015 | Balteanu |
| 9,083,455 | B2 | 7/2015 | Popplewell et al. |
| 9,088,249 | B2 | 7/2015 | Kaczman et al. |
| 9,092,393 | B2 | 7/2015 | Whitefield et al. |
| 9,118,277 | B2 | 8/2015 | Balteanu et al. |
| 9,143,096 | B2 | 9/2015 | Balteanu et al. |
| 9,189,430 | B2 | 11/2015 | Ross et al. |
| 9,197,128 | B2 | 11/2015 | Popplewell et al. |
| 9,258,156 | B2 | 2/2016 | Wloczysiak |
| 9,294,054 | B2 | 3/2016 | Balteanu et al. |
| 9,331,653 | B2 | 5/2016 | Khesbak |
| 9,391,648 | B2 | 7/2016 | Popplewell et al. |
| 9,425,833 | B2 | 8/2016 | Popplewell et al. |
| 9,445,371 | B2 | 9/2016 | Khesbak et al. |
| 9,548,702 | B2 | 1/2017 | Khesbak |
| 9,559,808 | B2 | 1/2017 | Rozenblit et al. |
| 9,584,070 | B2 | 2/2017 | Balteanu et al. |
| 9,588,529 | B2 | 3/2017 | Balteanu et al. |
| 9,606,947 | B2 | 3/2017 | Ross et al. |
| 9,668,215 | B2 | 5/2017 | Balteanu et al. |
| 9,673,707 | B2 | 6/2017 | Popplewell et al. |
| 9,698,832 | B2 | 7/2017 | Popplewell et al. |
| 9,774,300 | B2 | 9/2017 | Jin et al. |
| 9,806,676 | B2 | 10/2017 | Balteanu et al. |
| 9,831,834 | B2 | 11/2017 | Balteanu et al. |
| 9,866,176 | B2 | 1/2018 | Khesbak |
| 9,876,473 | B2 | 1/2018 | Khesbak et al. |
| 9,893,682 | B2 | 2/2018 | Zhu et al. |
| 9,935,582 | B2 | 4/2018 | Balteanu et al. |
| 9,948,241 | B2 | 4/2018 | Popplewell et al. |
| 9,971,377 | B2 | 5/2018 | Balteanu et al. |
| 9,973,088 | B2 | 5/2018 | Balteanu et al. |
| 9,990,322 | B2 | 6/2018 | Whitefield et al. |
| 9,991,856 | B2 | 6/2018 | Khesbak et al. |
| 10,063,343 | B2 | 8/2018 | Rozenblit et al. |
| 10,080,192 | B2 | 9/2018 | Balteanu et al. |
| 10,110,169 | B2 * | 10/2018 | Khesbak .............. H03F 1/0227 |
| 10,164,582 | B2 | 12/2018 | Zhu et al. |
| 10,170,989 | B2 | 1/2019 | Balteanu et al. |
| 10,181,820 | B2 | 1/2019 | Balteanu |
| 10,236,831 | B2 | 3/2019 | Khesbak et al. |
| 10,270,394 | B2 | 4/2019 | Drogi et al. |
| 10,277,177 | B2 | 4/2019 | Khesbak et al. |
| 10,320,345 | B2 | 6/2019 | Sharma |
| 10,333,470 | B2 | 6/2019 | Balteanu |
| 10,381,983 | B2 | 8/2019 | Balteanu et al. |
| 10,402,356 | B2 | 9/2019 | Ross et al. |
| 10,404,166 | B2 | 9/2019 | Khesbak et al. |
| 10,404,217 | B2 | 9/2019 | Popplewell et al. |
| 10,439,558 | B2 | 10/2019 | Sharma |
| 10,454,428 | B2 | 10/2019 | Khesback et al. |
| 10,454,429 | B2 | 10/2019 | Balteanu |
| 10,477,550 | B2 | 11/2019 | Balteanu |
| 10,483,918 | B2 | 11/2019 | Jin et al. |
| 10,516,368 | B2 | 12/2019 | Balteanu et al. |
| 10,536,116 | B2 | 1/2020 | Balteanu et al. |
| 10,574,192 | B2 | 2/2020 | Zhu et al. |
| 10,601,320 | B2 | 3/2020 | Balteanu et al. |
| 10,615,757 | B2 | 4/2020 | Balteanu et al. |
| 10,651,802 | B2 | 5/2020 | Khesbak et al. |
| 10,749,512 | B2 | 8/2020 | Balteanu et al. |
| 10,804,866 | B2 | 10/2020 | Lehtola |
| 10,804,867 | B2 | 10/2020 | Lehtola |
| 10,812,023 | B2 | 10/2020 | Balteanu et al. |
| 10,862,430 | B2 | 12/2020 | Drogi et al. |
| 10,873,297 | B2 | 12/2020 | Khesbak et al. |
| 10,972,055 | B2 | 4/2021 | Naraine et al. |
| 10,985,703 | B2 | 4/2021 | Balteanu et al. |
| 10,985,711 | B2 | 4/2021 | Balteanu et al. |
| 11,038,471 | B2 | 6/2021 | Drogi et al. |
| 11,064,491 | B2 | 7/2021 | Balteanu |
| 11,082,021 | B2 | 8/2021 | Zhang |
| 11,190,182 | B2 | 11/2021 | Balteanu et al. |
| 11,196,340 | B2 | 12/2021 | Khesbak et al. |
| 11,239,800 | B2 | 2/2022 | Drogi et al. |
| 11,374,538 | B2 | 6/2022 | Drogi et al. |
| 11,387,797 | B2 | 7/2022 | Drogi et al. |
| 11,444,576 | B2 | 9/2022 | Drogi |
| 11,482,975 | B2 | 10/2022 | Lyalin |
| 11,545,947 | B2 | 1/2023 | Lehtola |
| 11,728,775 | B2 | 8/2023 | Drogi |
| 11,855,595 | B2 | 12/2023 | Lyalin |
| 12,126,307 | B2 | 10/2024 | Balteanu |
| 2013/0057340 | A1 | 3/2013 | Kunihiro et al. |
| 2014/0306770 | A1 * | 10/2014 | Vetter ................... H03G 11/08 330/297 |
| 2018/0159476 | A1 | 6/2018 | Balteanu et al. |
| 2018/0159478 | A1 | 6/2018 | Balteanu et al. |
| 2019/0363684 | A1 | 11/2019 | Sharma |
| 2020/0127619 | A1 | 4/2020 | Khesbak et al. |
| 2020/0162028 | A1 | 5/2020 | Balteanu |
| 2021/0119592 | A1 | 4/2021 | Drogi et al. |
| 2021/0167734 | A1 | 6/2021 | Khesbak et al. |
| 2021/0234512 | A1 | 7/2021 | Balteanu et al. |
| 2022/0109404 | A1 | 4/2022 | Drogi et al. |
| 2023/0063006 | A1 | 3/2023 | Khesbak et al. |
| 2023/0065932 | A1 | 3/2023 | Khesbak et al. |
| 2023/0105489 | A1 | 4/2023 | Lyalin |
| 2023/0113416 | A1 | 4/2023 | Datta |
| 2024/0080005 | A1 | 3/2024 | Drogi |
| 2024/0113671 | A1 | 4/2024 | Drogi |

OTHER PUBLICATIONS

Florian et al., "Envelope tracking of an RF High Power Amplifier with an 8-Level Digitally Controlled GaN-on-Si Supply Modulator," IEEE Transactions on Microwave Theory and Techniques, vol. 63, No. 8, Aug. 2015, in 14 pages.

Vasic et al., "Comparison of Two Multilevel Architectures for Envelope Amplifier," Universidad Politecnica de Madrid, Centro de Electrónica Industrial, 2009, in 7 pages.

Huang et al., "A MASH-Controlled Multilevel Power Converter for high-Efficiency RF Transmitters," IEEE Transactions on Power Electronics, vol. 26, No. 4, Apr. 2011, in 10 pages.

Kashani et al., "Digital Multi-Level Closed Loop Design for Wideband Envelope Tracking Systems," 2016 ICSEE International Conference on the Science of Electrical Engineering, 2016, in 5 pages.

(56) References Cited

OTHER PUBLICATIONS

Kim et al., "Envelope Amplifier with Multiple-Linear Regulator for Envelope Tracking Power Amplifier," IEEE Transactions on Microwave Theory and Techniques, vol. 61, No. 11, Nov. 2013, in 10 pages.
Xi et al., "Feed-Forward Scheme Considering Bandwidth Limitation of Operational Amplifiers|for Envelope Tracking Power Supply Using Series-Connected Composite Configuration," IEEE Transactions on Industrial Electronics, vol. 60, No. 9, Sep. 2013, in 12 pages.

* cited by examiner

ENVELOPE TRACKING WITH ADJUSTABLE SLEW RATE

CROSS REFERENCE TO PRIORITY APPLICATIONS

Any and all applications for which a foreign or domestic priority claim is identified in the Application Data Sheet as filed with the present application are hereby incorporated by reference under 37 C.F.R. § 1.57.

BACKGROUND

Field

Embodiments of the invention relate to electronic systems, and in particular, electronic systems including power amplifiers used in radio frequency (RF) electronic systems.

Description of the Related Technology

Power amplifiers are used in radio frequency (RF) communication systems to amplify RF signals for transmission via antennas. It is important to manage the power of RF signal transmissions to prolong battery life and/or provide a suitable transmit power level. Examples of RF communication systems with one or more power amplifiers include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 450 MHz to about 6 GHz for certain communications standards.

SUMMARY OF CERTAIN INVENTIVE ASPECTS

In some aspects, the techniques described herein relate to an envelope tracker for a power amplifier, the envelope tracker including: an input configured to receive an envelope signal corresponding to an envelope of a radio frequency signal; an error amplifier configured to generate a power amplifier supply voltage; a signal bandwidth detection circuit configured to generate a detected bandwidth signal indicating a bandwidth of the envelope signal; and a shaping and control circuit configured to control a slew rate of the error amplifier based on the detected bandwidth signal.

The shaping and control circuit can be configured to control a mode of the envelope tracker based on the detected bandwidth signal. The shaping and control circuit can be configured to process the detected bandwidth signal to determine a number of resource blocks used by the radio frequency signal. The shaping and control circuit can include a mode control circuit configured to control a mode of the error amplifier based on the number of resource blocks used by the radio frequency signal. The shaping and control circuit can be configured to control the slew rate of the error amplifier based on the number of resource blocks used by the radio frequency signal.

The shaping and control circuit can be configured to decrease the slew rate of the error amplifier when the detected bandwidth signal indicates that the bandwidth of the envelope signal is less than a slew control bandwidth threshold. The shaping and control circuit can be configured to increase the slew rate of the error amplifier when the detected bandwidth signal indicates that the bandwidth of the envelope signal is greater than a slew control bandwidth threshold.

The shaping and control circuit can be configured to control the slew rate of the error amplifier by adjusting a number of active amplifying stages of the error amplifier. The shaping and control circuit can be configured to increase the number of active amplifying stages when the detected bandwidth signal indicates that the bandwidth of the envelope signal is greater than a slew control bandwidth threshold.

The shaping and control circuit can be configured to control the slew rate of the error amplifier by adjusting a bias current of the error amplifier. The shaping and control circuit can be configured to increase the bias current when the detected bandwidth signal indicates that the bandwidth of the envelope signal is greater than a slew control bandwidth threshold. The shaping and control circuit can be configured to control the slew rate of the error amplifier by controlling a number of active biasing stages of the error amplifier. The shaping and control circuit can be configured to increase the number of active biasing stages when the detected bandwidth signal indicates that the bandwidth of the envelope signal is greater than a slew control bandwidth threshold.

The shaping and control circuit can be configured to disable the error amplifier when the detected bandwidth signal indicates the bandwidth of the envelope signal is less than a first threshold bandwidth.

The shaping and control circuit can be configured to decrease a bias current of the error amplifier when the detected bandwidth signal indicates that the bandwidth of the envelope signal is greater than a first threshold bandwidth but less than a second threshold bandwidth.

The envelope tracker in some embodiments further includes a DC-to-DC converter. The error amplifier and the DC-to-DC converter can operate in parallel with one another to generate the power amplifier supply voltage when the detected bandwidth signal indicates the bandwidth of the envelope signal is greater than a second threshold bandwidth.

In some aspects, the techniques described herein relate to a power amplifier system including: a power amplifier configured to amplify a radio frequency signal and to receive power from a power amplifier supply voltage; and an envelope tracker configured to generate the power amplifier supply voltage based on an envelope signal corresponding to an envelope of the radio frequency signal, the envelope tracker including an error amplifier, a signal bandwidth detection circuit configured to generate a detected bandwidth signal indicating a bandwidth of the envelope signal, and a shaping and control circuit, the shaping and control circuit configured to control a slew rate of the error amplifier based on the detected bandwidth signal.

The shaping and control circuit can be configured to control a mode of the envelope tracker based on the detected bandwidth signal.

The shaping and control circuit can be configured to process the detected bandwidth signal to determine a number of resource blocks used by the radio frequency signal. The shaping and control circuit can include a mode control circuit configured to control a mode of the error amplifier based on the number of resource blocks used by the radio frequency signal. The shaping and control circuit can be configured to control the slew rate of the error amplifier based on the number of resource blocks used by the radio frequency signal.

The shaping and control circuit can be configured to decrease the slew rate of the error amplifier when the detected bandwidth signal indicates that the bandwidth of the envelope signal is less than a slew control bandwidth threshold. The shaping and control circuit can be configured to increase the slew rate of the error amplifier when the detected bandwidth signal indicates that the bandwidth of the envelope signal is greater than a slew control bandwidth threshold.

The shaping and control circuit can be configured to control the slew rate of the error amplifier by controlling a number of active amplifying stages of the error amplifier. The shaping and control circuit can be configured to increase the number of active amplifying stages when the detected bandwidth signal indicates that the bandwidth of the envelope signal is greater than a slew control bandwidth threshold.

The shaping and control circuit can be configured to control the slew rate of the error amplifier by controlling a bias current of the error amplifier. The shaping and control circuit can be configured to increase the bias current when the detected bandwidth signal indicates that the bandwidth of the envelope signal is greater than a slew control bandwidth threshold.

The shaping and control circuit can include a mode control circuit configured to disable the error amplifier when the detected bandwidth signal indicates the bandwidth of the envelope signal is less than a first threshold bandwidth.

The shaping and control circuit can include a mode control circuit configured to decrease a bias current of the error amplifier when the detected bandwidth signal indicates that the bandwidth of the envelope signal is greater than a first threshold bandwidth but less than a second threshold bandwidth.

The envelope tracker in some embodiments further includes a DC-to-DC converter. The error amplifier and the DC-to-DC converter can operate in parallel with one another to generate the power amplifier supply voltage when the detected bandwidth signal indicates the bandwidth of the envelope signal is greater than a second threshold bandwidth.

In some aspects, the techniques described herein relate to a mobile device including: a power amplifier configured to amplify a radio frequency signal and to receive power from a power amplifier supply voltage; an envelope tracker configured to generate the power amplifier supply voltage based on an envelope signal corresponding to an envelope of the radio frequency signal, the envelope tracker including an error amplifier, a signal bandwidth detection circuit configured to generate a detected bandwidth signal indicating a bandwidth of the envelope signal, and a shaping and control circuit, the shaping and control circuit configured to control a slew rate of the error amplifier based on the detected bandwidth signal; and an antenna configured to transmit the radio frequency signal amplified by the power amplifier.

The shaping and control circuit can be configured to control a mode of the envelope tracker based on the detected bandwidth signal. The shaping and control circuit can be configured to control the slew rate of the error amplifier by adjusting a number of active amplifying stages of the error amplifier. The shaping and control circuit can be configured to control the slew rate of the error amplifier by adjusting a bias current of the error amplifier.

In some aspects, the techniques described herein relate to an envelope tracker for a power amplifier, the envelope tracker including: an input configured to receive an envelope signal corresponding to an envelope of a radio frequency signal; an error amplifier configured to generate a power amplifier supply voltage, the error amplifier including a plurality of amplifying stages, one or more of the plurality of amplifying stages configured to be selectively activated to adjust a slew rate of the error amplifier; and a control circuit configured to control the error amplifier to selectively activate the one or more amplifying stages.

The control circuit can control the error amplifier based on a bandwidth of the envelope signal. The envelope tracker can further include a bandwidth detection circuit configured to generate a detected bandwidth signal indicating the bandwidth of the envelope signal and to provide the detected bandwidth signal to the control circuit. The control circuit can be configured to process the detected bandwidth signal to determine a number of resource blocks used by the radio frequency signal.

The control circuit can be further configured to control a mode of the error amplifier based on the number of resource blocks.

The control circuit can be configured to control the error amplifier to selectively activate the one or more amplifying stages to control the slew rate of the error amplifier based on the number of resource blocks. The control circuit can be configured to control the error amplifier to selectively deactivate the one or more amplifying stages to decrease the slew rate of the error amplifier when the detected bandwidth signal indicates that the bandwidth of the envelope signal is less than a slew control bandwidth threshold. The control circuit can be configured to control the error amplifier to selectively activate the one or more amplifying stages to increase the slew rate of the error amplifier when the detected bandwidth signal indicates that the bandwidth of the envelope signal is greater than a slew control bandwidth threshold.

The control circuit can be configured to disable the error amplifier when the detected bandwidth signal indicates the bandwidth of the envelope signal is less than a first threshold bandwidth.

In some aspects, the techniques described herein relate to an envelope tracker wherein the envelope tracker further includes a DC-to-DC converter. The error amplifier and the DC-to-DC converter can operate in parallel with one another to generate the power amplifier supply voltage when the detected bandwidth signal indicates the bandwidth of the envelope signal is greater than a second threshold bandwidth.

In some aspects, the techniques described herein relate to a radio frequency front end module including: a power amplifier configured to amplify a radio frequency signal and to receive power from a power amplifier supply voltage; an envelope tracker configured to receive an envelope signal corresponding to an envelope of the radio frequency signal, the envelope tracker including an error amplifier configured to generate the power amplifier supply voltage, the error amplifier including a plurality of amplifying stages, one or more of the plurality of amplifying stages configured to be selectively activated to adjust a slew rate of the error amplifier; and a control circuit configured to control the error amplifier to selectively activate the one or more amplifying stages.

The control circuit can control the error amplifier based on a bandwidth of an envelope signal. The front end module can further include a bandwidth detection circuit configured to detect the bandwidth of the envelope signal and to provide the detected bandwidth to the control circuit. The control circuit can be configured to process the detected bandwidth signal to determine a number of resource blocks used by the radio frequency signal.

In some aspects, the techniques described herein relate to a front end module wherein the control circuit is configured to control a mode of the error amplifier based on the number of resource blocks.

The control circuit can be configured to control the error amplifier to selectively activate the one or more amplifying stages to control the slew rate of the error amplifier based on the number of resource blocks. The control circuit can be configured to control the error amplifier to selectively deactivate the one or more amplifying stages to decrease the slew rate of the error amplifier when the detected bandwidth signal indicates that the bandwidth of the envelope signal is less than a slew control bandwidth threshold.

The control circuit can be configured to control the error amplifier to selectively activate the one or more amplifying stages to increase the slew rate of the error amplifier when the detected bandwidth signal indicates that the bandwidth of the envelope signal is greater than a slew control bandwidth threshold.

The control circuit can be configured to disable the error amplifier when the detected bandwidth signal indicates the bandwidth of the envelope signal is less than a first threshold bandwidth.

The envelope tracker can further include a DC-to-DC converter configured to operate in parallel with the error amplifier to generate the power amplifier supply voltage when the detected bandwidth signal indicates the bandwidth of the envelope signal is greater than a second threshold bandwidth.

In some aspects, the techniques described herein relate to a mobile device including: a power amplifier system including a power amplifier configured to amplify a radio frequency signal and to receive power from a power amplifier supply voltage, an error amplifier configured to generate the power amplifier supply voltage, and a control circuit, the error amplifier including a plurality of amplifying stages, one or more of the plurality of amplifying stages configured to be selectively activated to adjust a slew rate of the error amplifier, the control circuit configured to control the error amplifier to selectively activate the one or more amplifying stages; and an antenna configured to transmit the amplified radio frequency signal.

The control circuit can controls the error amplifier based on a bandwidth of the envelope signal. The control circuit can be configured to determine a number of resource blocks, the number of resource blocks corresponding to the bandwidth. The control circuit can be configured to control a mode of the error amplifier based on the bandwidth. The control circuit can be configured to selectively activate the one or more amplifying stages to adjust the slew rate of the error amplifier based on the bandwidth. The envelope tracker can further include a DC-to-DC converter, and the error amplifier and the DC-to-DC converter can operate in parallel with one another to generate the power amplifier supply voltage when the bandwidth satisfies a condition.

In some aspects, the techniques described herein relate to an envelope tracker for a power amplifier, the envelope tracker including: an input configured to receive an envelope signal corresponding to an envelope of a radio frequency signal; an error amplifier configured to generate a power amplifier supply voltage, the error amplifier including a biasing stage configured to adjust a slew rate of the error amplifier; a control circuit configured to control the error amplifier by controlling the biasing stage.

The control circuit can adjust the slew rate of the error amplifier based on a bandwidth of the envelope signal.

The biasing stage can include a plurality of biasing stages, one or more of the plurality of biasing stages configured to be selectively activated or deactivated to adjust a slew rate of the error amplifier by adjusting a bias current provided to an amplifying stage of the error amplifier.

The control circuit can be configured to selectively activate or deactivate the one or more of the plurality of biasing stages. The envelope tracker can further include one or more slew rate switches usable to selectively activate or deactivate one or more of the plurality of biasing stages. The control circuit can be configured to control the error amplifier by selectively deactivating the one or more biasing stages to decrease the slew rate of the error amplifier when a bandwidth of the envelope signal is less than a slew control bandwidth threshold. The control circuit can be configured to control the error amplifier by selectively activating the one or more biasing stages to increase the slew rate of the error amplifier when a bandwidth of the envelope signal is greater than a slew control bandwidth threshold. The control circuit can be configured to control the error amplifier by selectively activating the one or more biasing stages to increase the bias current provided to an amplifying stage when a bandwidth of the envelope signal is greater than a slew control bandwidth threshold.

The envelope tracker can further include a bandwidth detection circuit configured to generate a detected bandwidth signal indicating the bandwidth of the envelope signal and to provide the bandwidth signal to the control circuit. The control circuit can be configured to process the detected bandwidth signal to determine a number of resource blocks used by the radio frequency signal.

The error amplifier can further include an amplifying stage, and the biasing stage is configured to control a bias of the amplifying stage. The control circuit can be configured to control the biasing stage to reduce a bias current provided to error amplifier and to decrease the slew rate of the error amplifier when a bandwidth of the envelope signal is less than a slew control bandwidth threshold. The control circuit can be configured to control the biasing stage to increase a bias current provided to the error amplifier and to increase the slew rate of the error amplifier when a bandwidth of the envelope signal is greater than a slew control bandwidth threshold.

The control circuit can be configured to disable the error amplifier when a detected bandwidth of the envelope signal is less than a first threshold bandwidth.

The envelope tracker can further include a DC-to-DC converter. The error amplifier and the DC-to-DC converter can operate in parallel with one another to generate the power amplifier supply voltage when a bandwidth of the envelope signal is greater than a second threshold bandwidth.

In some aspects, the techniques described herein relate to a radio frequency front end module including: a power amplifier configured to amplify a radio frequency signal and to receive power from a power amplifier supply voltage; an envelope tracker including an error amplifier configured to generate the power amplifier supply voltage, the error amplifier including a plurality of biasing stages, one or more of the plurality of biasing stages configured to be selectively adjust a slew rate of the error amplifier, the envelope tracker further including a control circuit configured to control the error amplifier to selectively activate the one or more biasing stages.

The control circuit can control the error amplifier based on a bandwidth of an envelope signal corresponding to an envelope of the radio frequency signal.

The front end module further can include a bandwidth detection circuit configured to generate a detected bandwidth signal indicating a bandwidth of the envelope signal and to provide the detected bandwidth signal to the control circuit. The control circuit can be configured to process the detected bandwidth signal to determine a number of resource blocks used by the radio frequency signal. The control circuit can be configured to control a slew rate of the error amplifier based on the number of resource blocks. The control circuit can be configured to control the error amplifier to selectively activate the one or more biasing stages to control the slew rate of the error amplifier based on the number of resource blocks.

The control circuit can be configured to control the error amplifier to selectively deactivate the one or more biasing stages to decrease the slew rate of the error amplifier when a bandwidth of the envelope signal is less than a slew control bandwidth threshold. The control circuit can be configured to control the error amplifier to selectively activate the one or more biasing stages to increase the slew rate of the error amplifier when a bandwidth of the envelope signal is greater than a slew control bandwidth threshold. The control circuit can be configured to control the error amplifier to selectively activate the one or more biasing stages to increase a bias current provided to the amplifying stage when a bandwidth of the envelope signal is greater than a slew control bandwidth threshold.

The control circuit can be configured to disable the error amplifier when a bandwidth of the envelope signal is less than a first threshold bandwidth.

The envelope tracker can further include a DC-to-DC converter. The error amplifier and the DC-to-DC converter can operate in parallel with one another to generate the power amplifier supply voltage when a bandwidth of the envelope signal is greater than a second threshold bandwidth.

In some aspects, the techniques described herein relate to a mobile device including: a power amplifier system including a power amplifier configured to amplify a radio frequency signal and to receive power from a power amplifier supply voltage, an error amplifier configured to generate the power amplifier supply voltage, and a control circuit, the error amplifier including a plurality of biasing stages configured to bias an amplifying stage, one or more of the plurality of biasing stages configured to adjust a slew rate of the error amplifier, the control circuit configured to control the error amplifier to selectively activate the one or more biasing stages; and an antenna configured to transmit the amplified radio frequency signal.

The error amplifier can further include an amplifying stage, and the plurality of biasing stages can be configured to control a bias of the amplifying stage. The mobile device can further include one or more slew rate switches usable to selectively activate the one or more of the plurality of biasing stages.

The mobile device can include a bandwidth detection circuit configured to generate a detected bandwidth signal indicating a bandwidth of the envelope signal and to provide the bandwidth signal to the control circuit. The control circuit can be configured to process the detected bandwidth signal to determine a number of resource blocks used by the radio frequency signal.

The envelope tracker can further include a DC-to-DC converter, and the error amplifier and the DC-to-DC converter can operate in parallel with one another to generate the power amplifier supply voltage when a bandwidth of the envelope signal satisfies a condition.

DETAILED DESCRIPTION OF EMBODIMENTS

Figure 1:
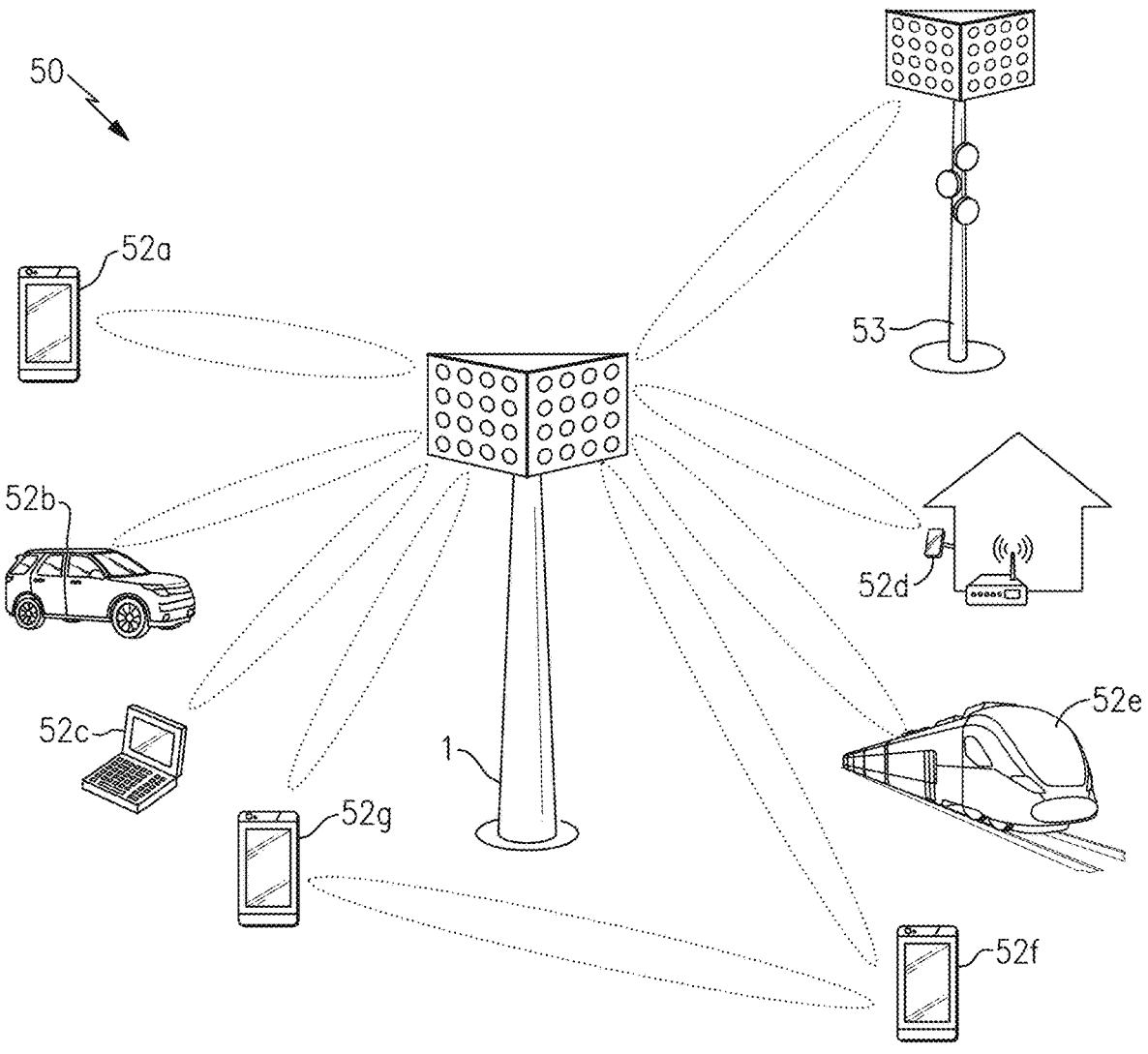
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Overview of Examples of Communication Network Based on Carrier Aggregation

FIG. 1 is a schematic diagram of one example of a communication network 50. The communication network 50 includes a macro cell base station 1, a small cell base station 53, and various examples of user equipment (UE), including a first mobile device 52a, a wireless-connected car 52b, a laptop 52c, a stationary wireless device 52d, a wireless-connected train 52e, a second mobile device 52f, and a third mobile device 52g.

Although specific examples of base stations and user equipment are illustrated in FIG. 1, a communication network can include base stations and user equipment of a wide variety of types and/or numbers.

For instance, in the example shown, the communication network 50 includes the macro cell base station 1 and the small cell base station 53. The small cell base station 53 can operate with relatively lower power, shorter range, and/or with fewer concurrent users relative to the macro cell base station 1. The small cell base station 53 can also be referred to as a femtocell, a picocell, or a microcell. Although the communication network 50 is illustrated as including two base stations, the communication network 50 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 50 of FIG. 1 supports communications using a variety of cellular technologies, including, for example, 4G LTE and 5G NR. In certain implementations, the communication network 50 is further adapted to provide a wireless local area network (WLAN), such as WiFi. Although various examples of communication technologies have been provided, the communication network 50 can be adapted to support a wide variety of communication technologies.

Various communication links of the communication network 50 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 50 can be implemented to support self-fronthaul and/or self-backhaul (for instance, as between mobile device 52g and mobile device 52f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 50 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 50 of FIG. 1 can be used to support a wide variety of advanced communication features, including, but not limited to, eMBB, uRLLC, and/or mMTC.

Figure 2:
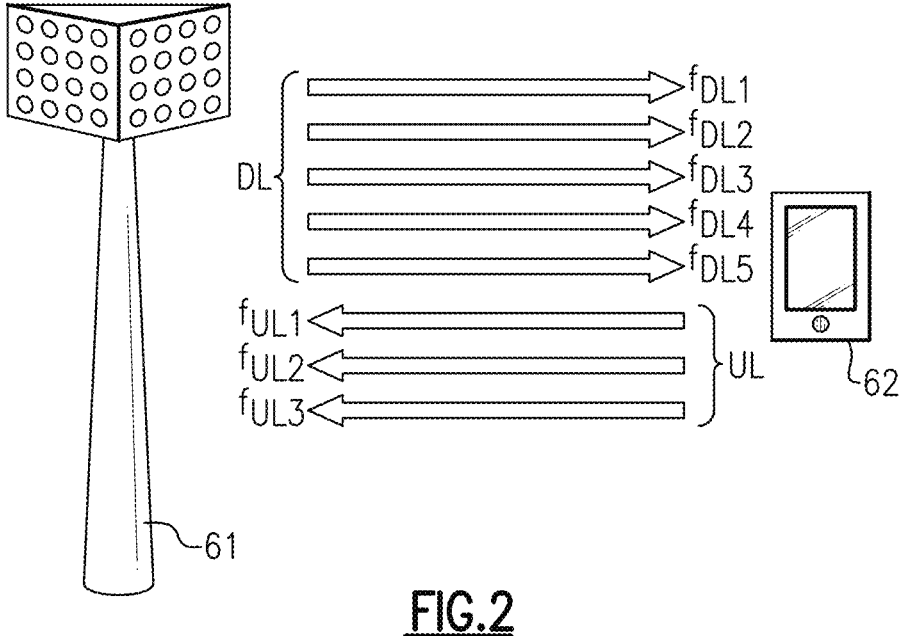
FIG. 2 is a schematic diagram of one example of a communication link using carrier aggregation.

FIG. 2 is a schematic diagram of one example of a communication link using carrier aggregation. Carrier aggregation can be used to widen bandwidth of the communication link by supporting communications between a base station and a mobile device using multiple carrier frequencies, thereby increasing the rate of data transmission between the base station and the mobile device resulting in enhanced network capacity by utilizing fragmented spectrum allocations.

In the illustrated example, the communication link is provided between a base station 61 and a mobile device 62. As shown in FIG. 2, the communications link includes a downlink channel (DL) used for RF communications from the base station 61 to the mobile device 62, and an uplink (UL) channel used for RF communications from the mobile device 62 to the base station 61.

Although FIG. 2 illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 61 and the mobile device 62 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 3:
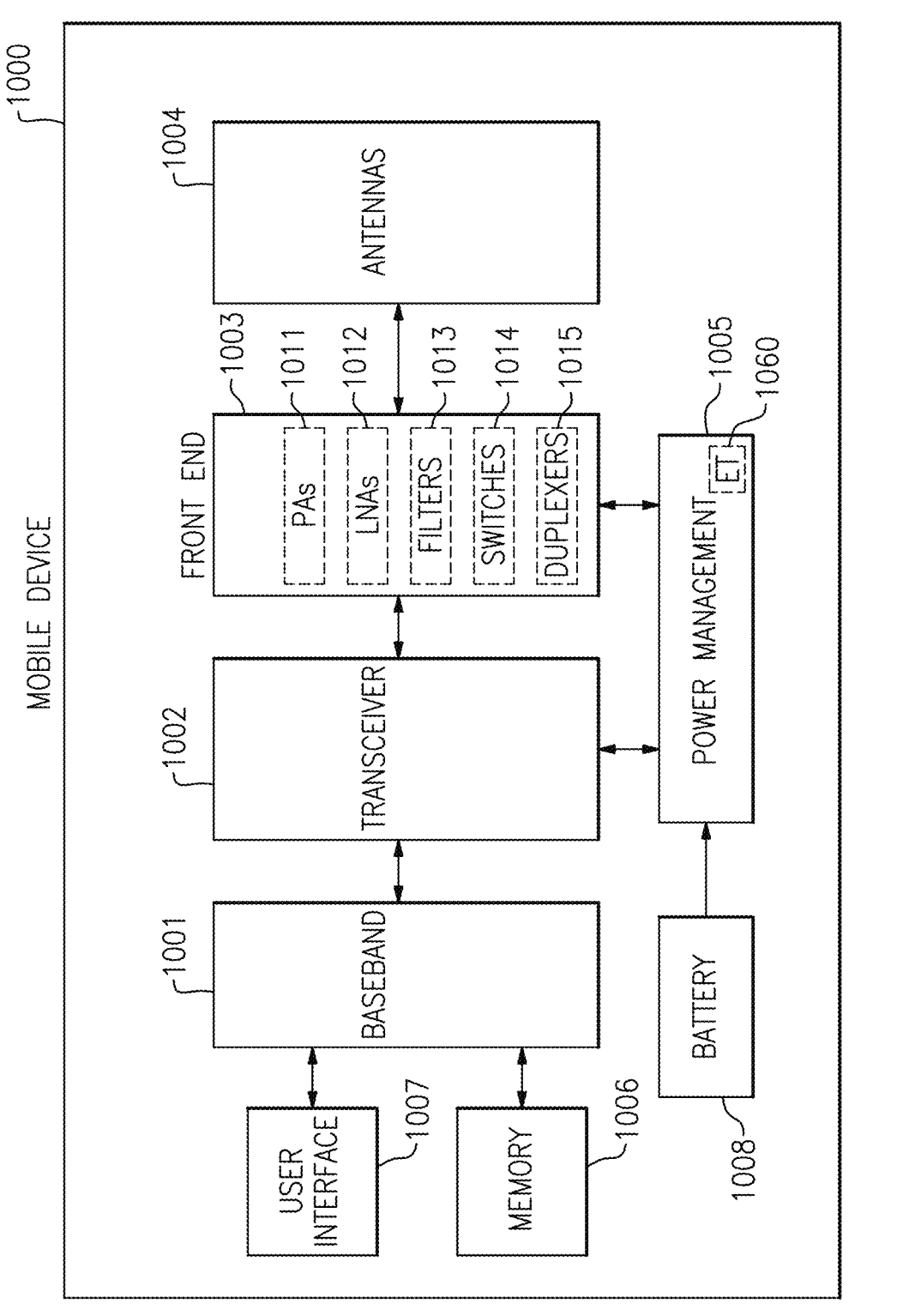
FIG. 3 is a schematic diagram of one example of a mobile wireless communication device.

Overview of Examples of Radio Frequency Systems Including an Envelope Tracker FIG. 3 is a schematic diagram of one example of a mobile device 1000. The mobile device 1000 includes a baseband system 1001, a transceiver 1002, a front end system 1003, antennas 1004, a power management system 1005, a memory 1006, a user interface 1007, and a battery 1008.

The mobile device 1000 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and Zig-Bee), WMAN (for instance, WiMax), and/or GPS technologies.

The transceiver 1002 generates RF signals for transmission and processes incoming RF signals received from the antennas 1004. It will be understood that various functionalities associated with the transmission and receiving of RF signals can be achieved by one or more components that are collectively represented in FIG. 3 as the transceiver 1002. In one example, separate components (for instance, separate circuits or dies) can be provided for handling certain types of RF signals.

The front end system 1003 aids is conditioning signals transmitted to and/or received from the antennas 1004. In the illustrated embodiment, the front end system 1003 includes power amplifiers (PAs) 1011, low noise amplifiers (LNAs) 1012, filters 1013, switches 1014, and duplexers 1015. However, other implementations are possible.

For example, the front end system 1003 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 1000 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band and/or in different bands.

The antennas 1004 can include antennas used for a wide variety of types of communications. For example, the antennas 1004 can include antennas associated transmitting and/or receiving signals associated with a wide variety of frequencies and communications standards.

In certain implementations, the antennas 1004 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 1000 can operate with beamforming in certain implementations. For example, the front end system 1003 can include phase shifters having variable phase controlled by the transceiver 1002. Additionally, the phase shifters are controlled to provide beam formation and directivity for transmission and/or reception of signals using the antennas 1004. For example, in the context of signal transmission, the phases of the transmit signals provided to the antennas 1004 are controlled such that radiated signals from the antennas 1004 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 1004 from a particular direction. In certain implementations, the antennas 1004 include one or more arrays of antenna elements to enhance beamforming.

The baseband system 1001 is coupled to the user interface 1007 to facilitate processing of various user input and output (I/O), such as voice and data. The baseband system 1001 provides the transceiver 1002 with digital representations of transmit signals, which the transceiver 1002 processes to generate RF signals for transmission. The baseband system 1001 also processes digital representations of received signals provided by the transceiver 1002. As shown in FIG. 3, the baseband system 1001 is coupled to the memory 1006 of facilitate operation of the mobile device 1000.

The memory 1006 can be used for a wide variety of purposes, such as storing data and/or instructions to facilitate the operation of the mobile device 1000 and/or to provide storage of user information.

The power management system 1005 provides a number of power management functions of the mobile device 1000. The power management system 1005 of FIG. 3 includes an envelope tracker 1060, which can be implemented in accordance with one or more features of the present disclosure. As shown in FIG. 3, the power management system 1005 receives a battery voltage form the battery 1008. The battery 1008 can be any suitable battery for use in the mobile device 1000, including, for example, a lithium-ion battery.

In some implementations, the envelope tacker 1060 may include one or more error amplifiers (e.g., linear amplifiers) with controllable slew rates. In some examples, the slew rate of each of the one or more error amplifiers may be controlled by changing one or more of: a number of active amplifying stages, a number of transistors used to amplify a signal, or the biasing of the error amplifier. In some implementations, the envelope tracker 1060 may adaptively adjust the slew rate of the one or more error amplifier based on a bandwidth of a radio frequency signal that is amplified by power amplifiers 1011 receiving power from the envelope tracker 1060. The bandwidth can be the bandwidth of an envelope signal associated with the radio frequency signal comprising a radio frequency carrier modulated by a signal (e.g., amplitude modulated, frequency, modulated, phase modulated and the like). Dynamic adjustment of the slew rate of the error amplifiers used in the envelope tracker 1060 may improve the tradeoff between efficiency and operational bandwidth of the envelope tracker 1060.

The mobile device 1000 of FIG. 3 illustrates one example of an RF system that can include an envelope tracking system implemented in accordance with one or more features of the present disclosure. However, the teachings herein are applicable to RF systems implemented in a wide variety of ways.

Figure 4:
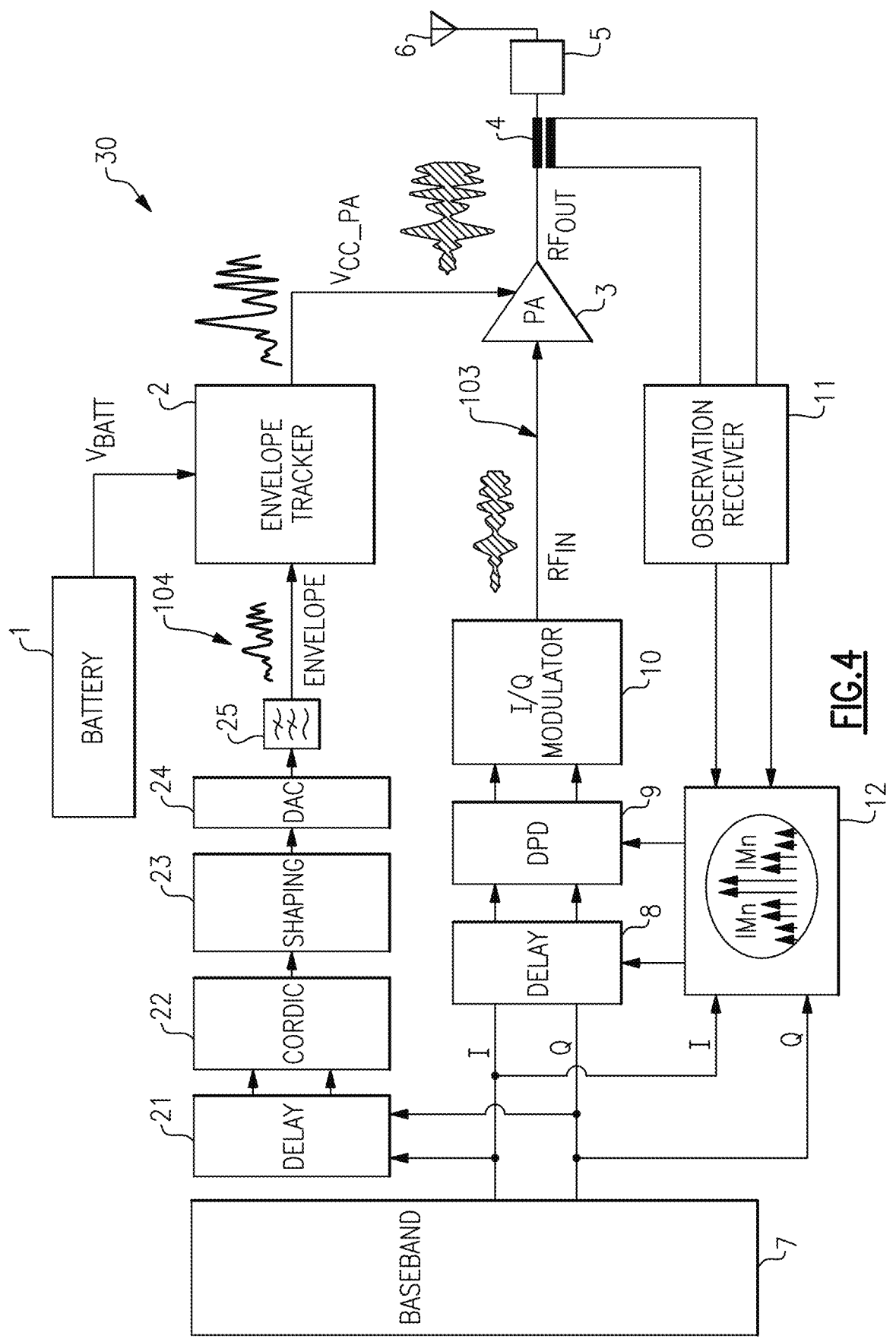
FIG. 4 is a schematic diagram of one example of a communication system for transmitting radio frequency (RF) signals.

FIG. 4 is a schematic diagram of one example of a communication system 30 for transmitting RF signals. The communication system 30 includes a battery 1, an envelope tracker 2, a power amplifier 3, a directional coupler 4, a duplexing and switching circuit 5, an antenna 6, a baseband processor 7, a signal delay circuit 8, a digital pre-distortion (DPD) circuit 9, an I/Q modulator 10, an observation receiver 11, an intermodulation detection circuit 12, an envelope delay circuit 21, a coordinate rotation digital computation (CORDIC) circuit 22, a shaping circuit 23, a digital-to-analog converter 24, and a reconstruction filter 25.

The communication system 30 of FIG. 4 illustrates one example of an RF system (e.g., an RF transmitter of a mobile device) that can include an envelope tracking system implemented in accordance with one or more features of the present disclosure. However, the teachings herein are applicable to RF systems implemented in a wide variety of ways. In some examples, the envelope tracker 2 of the RF transmitter may include one or more error amplifiers with controllable slew rates and one or more control circuits that may adaptively control the corresponding slew rates based on a bandwidth of an envelope signal 104 fed to the envelope tracker 2. The envelope signal 104 may be the envelope of an RF signal 103 amplified by the power amplifier 3 before being transmitted the antenna 6. The radio frequency signal 103 may include an RF carrier modulated by a data signal (e.g., digital or analog signal associated with a data stream).

The baseband processor 7 operates to generate an I signal and a Q signal, which correspond to signal components of a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals are provided to the I/Q modulator 10 in a digital format. The baseband processor 7 can be any suitable processor configured to process a baseband signal. For instance, the baseband processor 7 can include a digital signal processor, a microprocessor, a programmable core, or any combination thereof.

The signal delay circuit 8 provides adjustable delay to the I and Q signals to aid in controlling relative alignment between the envelope signal and the RF signal $RF_{IN}$. The amount of delay provided by the signal delay circuit 8 is controlled based on amount of intermodulation detected by the intermodulation detection circuit 12.

The DPD circuit 9 operates to provide digital shaping to the delayed I and Q signals from the signal delay circuit 8 to generate digitally pre-distorted I and Q signals. In the illustrated embodiment, the DPD provided by the DPD circuit 9 is controlled based on amount of intermodulation detected by the intermodulation detection circuit 12. The DPD circuit 9 serves to reduce a distortion of the power amplifier 3 and/or to increase the efficiency of the power amplifier 3.

The I/Q modulator 10 receives the digitally pre-distorted I and Q signals, which are processed to generate an RF signal $RF_{IN}$. For example, the I/Q modulator 10 can include DACs configured to convert the digitally pre-distorted I and Q signals into an analog format, mixers for upconverting the analog I and Q signals to radio frequency, and a signal combiner for combining the upconverted I and Q signals into an RF signal suitable for amplification by the power amplifier 3. In certain implementations, the I/Q modulator 10 can include one or more filters configured to filter frequency content of signals processed therein.

The envelope delay circuit 21 delays the I and Q signals received from the baseband processor 7. Additionally, the CORDIC circuit 22 processes the delayed I and Q signals to generate a digital envelope signal representing an envelope of the RF signal $RF_{IN}$. Although FIG. 4 illustrates an implementation using the CORDIC circuit 22, a digital envelope signal can be obtained in other ways.

The shaping circuit 23 operates to shape the digital envelope signal to enhance the performance of the communication system 30. In certain implementations, the shaping circuit 23 includes a shaping table that maps each level of the digital envelope signal to a corresponding shaped envelope signal level. Envelope shaping can aid in controlling linearity, distortion, and/or efficiency of the power amplifier 3.

In the illustrated embodiment, the shaped envelope signal is a digital signal that is converted by the DAC 24 to an analog envelope signal. Additionally, the analog envelope signal is filtered by the reconstruction filter 25 to generate an envelope signal 104 suitable for use by the envelope tracker 2. In certain implementations, the reconstruction filter 25 includes a low pass filter.

With continuing reference to FIG. 4, the envelope tracker 2 receives the envelope signal 104 from the reconstruction filter 25 and a battery voltage $V_{BATT}$ from the battery 1, and uses the envelope signal 104 to generate a power amplifier supply voltage $V_{CC\_PA}$ for the power amplifier 3 that changes in relation to the envelope of the RF signal $RF_{IN}$. The power amplifier 3 receives the RF signal $RF_{IN}$ from the I/Q modulator 10, and provides an amplified RF signal $RF_{OUT}$ to the antenna 6 through the duplexing and switching circuit 5, in this example. In some embodiments, the operation bandwidth (speed) of the envelope tracker 2 may also be changed in relation to the envelope of the RF signal $RF_{IN}$ (e.g., by adjusting the slew rate of error amplifiers included in the envelope tracker 2 based at least in part on the envelope signal 104).

The directional coupler 4 is positioned between the output of the power amplifier 3 and the input of the duplexing and switching circuit 5, thereby allowing a measurement of output power of the power amplifier 3 that does not include insertion loss of the duplexing and switching circuit 5. The sensed output signal from the directional coupler 4 is provided to the observation receiver 11, which can include mixers for down converting I and Q signal components of the sensed output signal, and DACs for generating I and Q observation signals from the downconverted signals.

The intermodulation detection circuit 12 determines an intermodulation product between the I and Q observation signals and the I and Q signals from the baseband processor 7. Additionally, the intermodulation detection circuit 12 controls the DPD provided by the DPD circuit 9 and/or a delay of the signal delay circuit 8 to control relative alignment between the envelope signal and the RF signal $RF_{IN}$.

By including a feedback path from the output of the power amplifier 3 and baseband, the I and Q signals can be dynamically adjusted to optimize the operation of the communication system 30. For example, configuring the communication system 30 in this manner can aid in providing power control, compensating for transmitter impairments, and/or in performing DPD.

Although illustrated as a single stage, the power amplifier 3 can include one or more stages. Furthermore, the teachings herein are applicable to communication systems including multiple power amplifiers. In such implementations, separate envelope trackers can be provided for different power amplifiers and/or one or more shared envelope trackers can be used. In various implementations, the one or more envelope trackers may include an error amplifier with adaptively controlled slew rate.

Figure 5:
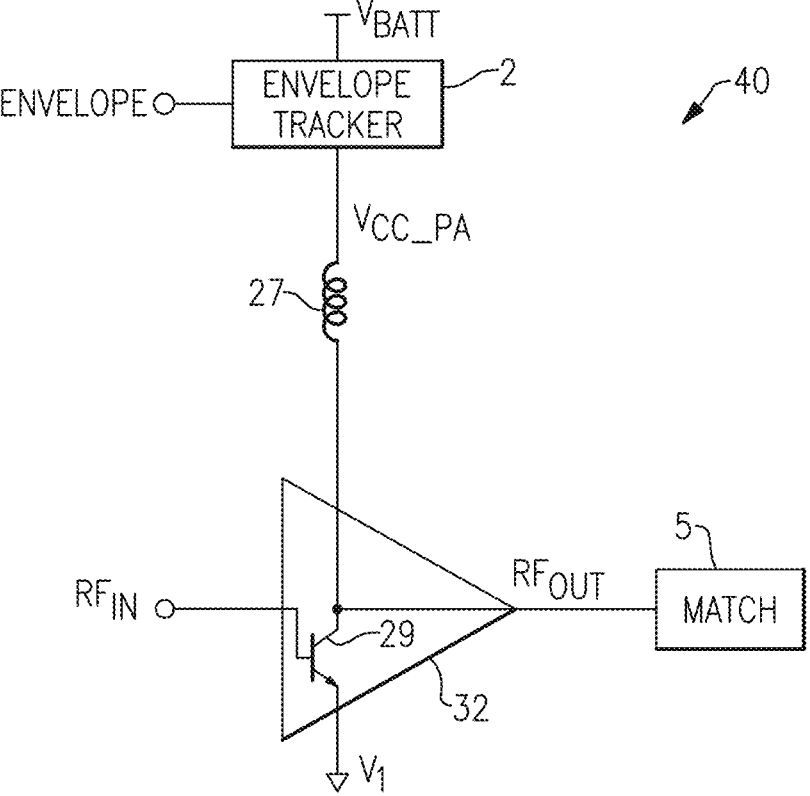
FIG. 5 is a schematic diagram of one example of a power amplifier system including an envelope tracker (ET).

FIG. 5 is a schematic diagram of one example of a power amplifier system 40 including an envelope tracker 2, for amplifying an RF signal $RF_{IN}$. The illustrated power amplifier system 40 further includes an inductor 27, an impedance matching circuit 5, and a power amplifier 32. The illustrated envelope tracker 2 is configured to receive an envelope signal (e.g., an envelope signal 104) corresponding to the envelope of the RF input signal $RF_{IN}$ and to generate a power amplifier supply voltage $V_{CC\_PA}$ for the power amplifier 32 based on the received envelope signal using a battery voltage $V_{BATT}$.

The illustrated power amplifier 32 includes a bipolar transistor 29 having an emitter, a base, and a collector. As shown in FIG. 5, the emitter of the bipolar transistor 29 is electrically connected to a power low supply voltage Vi, which can be, for example, a ground supply. Additionally, an RF signal ($RF_{IN}$) is provided to the base of the bipolar transistor 29, and the bipolar transistor 29 amplifies the RF input signal $RF_{IN}$ to generate an amplified RF signal $RF_{OUT}$ at the collector. The bipolar transistor 29 can be any suitable device. In one implementation, the bipolar transistor 29 is a heterojunction bipolar transistor (HBT).

The impedance matching circuit 5 serves to terminate the output of the power amplifier 32, which can aid in increasing power transfer and/or reducing reflections of the amplified RF signal generated by the power amplifier 32. In certain implementations, the impedance matching circuit 31 further operates to provide harmonic termination.

The inductor 27 can be included to power the power amplifier 32 with the power amplifier supply voltage $V_{CC\_PA}$ generated by the envelope tracker 2 while choking or blocking high frequency RF signal components. The inductor 27 can include a first end electrically connected to the envelope tracker 2, and a second end electrically connected to the collector of the bipolar transistor 29. In certain implementations, the inductor 27 operates in combination with the impedance matching circuit 31 to provide output matching.

Although FIG. 5 illustrates one implementation of the power amplifier 32, skilled artisans will appreciate that the teachings described herein can be applied to a variety of power amplifier structures, such as multi-stage power amplifiers and power amplifiers employing other transistor structures. For example, in some implementations the bipolar transistor 29 can be omitted in favor of employing a field-effect transistor (FET), such as a silicon FET, a gallium arsenide (GaAs) high electron mobility transistor (HEMT), or a laterally diffused metal oxide semiconductor (LDMOS) transistor. Additionally, the power amplifier 32 can be adapted to include additional circuitry, such as biasing circuitry.

Figure 6A:
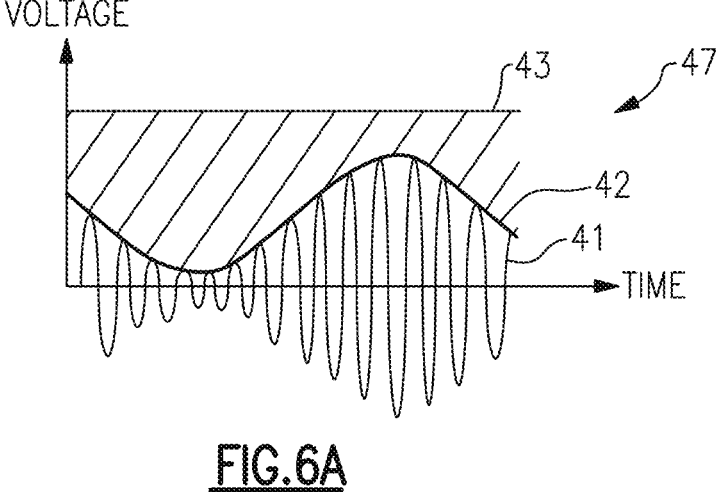
FIGS. 6A-6B show two examples of power amplifier supply voltage versus time.
Figure 6B:
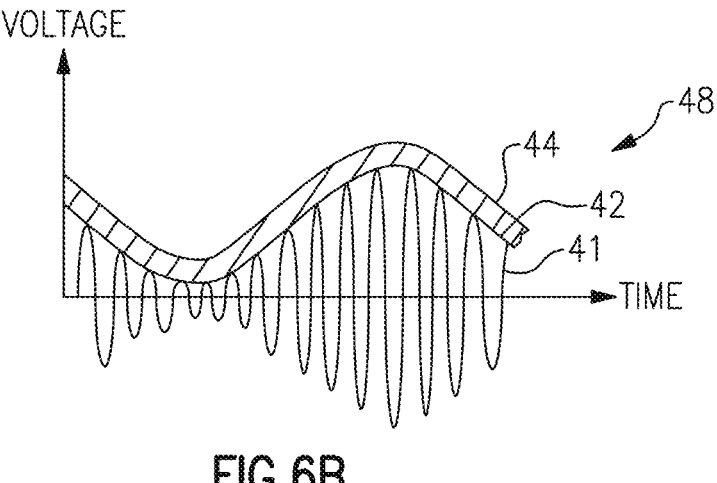

FIGS. 6A-6B show two examples of power amplifier supply voltage versus time.

In FIG. 6A, a graph 47 illustrates one example of the voltage of an RF signal 41 and a power amplifier supply voltage 43 versus time. The RF signal 41 has an envelope 42.

It can be important that the power amplifier supply voltage 43 of a power amplifier has a voltage greater than that of the RF signal 41. For example, powering a power amplifier using a power amplifier supply voltage that has a magnitude less than that of the RF signal can clip the RF signal, thereby creating signal distortion and/or other problems. Thus, it can be important the power amplifier supply voltage 43 be greater than that of the envelope 42. However, it can be desirable to reduce a difference in voltage between the power amplifier supply voltage 43 and the envelope 42 of the RF signal 41, as the area between the power amplifier supply voltage 43 and the envelope 42 can represent lost energy, which can reduce battery life and increase heat generated in a wireless device.

In FIG. 6B, a graph 48 illustrates another example of the voltage of an RF signal 41 and a power amplifier supply voltage 44 versus time. In contrast to the power amplifier supply voltage 43 of FIG. 6A, the power amplifier supply voltage 44 of FIG. 6B changes in relation to the envelope 42 of the RF signal 41. The area between the power amplifier supply voltage 44 and the envelope 42 in FIG. 6B is less than the area between the power amplifier supply voltage 43 and the envelope 42 in FIG. 6A, and thus the graph 48 of FIG. 6B can be associated with a power amplifier system having greater energy efficiency. The power amplifier supply voltage 44 may be provided by an envelope tracker (e.g., envelop tracker 2 in FIGS. 4 and 5), that dynamically adjusts the power amplifier supply voltage 44 to maintain the area between the power amplifier supply voltage 43 and the envelope 42 below a maximum value. Advantageously, if the slew rate of the error amplifier used in the envelope tracker can be adjusted based on a bandwidth of envelope 42, the area between the power amplifier supply voltage 44 and the envelope 42 may be maintained below a maximum value for a wide range of envelope bandwidths while also maintaining the linearity of the amplification process.

Overview of Examples of Envelope Tracking Systems

Envelope tracking is a technique that can be used to increase power added efficiency (PAE) of a power amplifier system by efficiently controlling a voltage level of a power amplifier supply voltage in relation to an envelope of the RF signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

In one example, an envelope tracker includes a DC-to-DC (e.g., a switcher) converter that operates in combination with an error amplifier to generate a power amplifier supply voltage based on an envelope signal 104. For example, the DC-to-DC converter and the error amplifier can be electrically connected in parallel with one another, and the DC-to-DC converter can track low frequency components of the envelope signal 104 while the error amplifier can track high frequency components of the envelope signal 104. For example, the DC-to-DC converter's switching frequency can be reduced to be less than a marginal frequency component of the envelope signal 104, and the error amplifier can operate to smooth gaps in the DC-to-DC converter's output to generate the power amplifier supply voltage. In some examples, the gaps in the DC-to-DC converter's output may be associated with the frequency components of the envelope signals 104 that are greater than the marginal frequency component. In certain implementations, the DC-to-DC converter and error amplifier are combined via a combiner. In some examples, the combiner can be an AC combiner configured to combine the low frequency portion of DC-to-DC converter's output with high frequency portion of the error amplifier.

In another example, an envelope tracker includes a multi-output boost switcher for generating regulated voltages of different voltage levels, a bank of switches for controlling selection of a suitable regulated voltage over time based on the envelope signal, and a filter for filtering the output of the switch bank to generate the power amplifier supply voltage.

Apparatus and methods for envelope tracking systems with automatic mode selection are provided herein. In certain configurations, a power amplifier system includes a power amplifier that amplifies a radio frequency signal and that receives power from a power amplifier supply voltage. The power amplifier system further includes an envelope tracker that generates the power amplifier supply voltage based on an envelope signal corresponding to an envelope of the radio frequency signal. The envelope tracker further includes a signal bandwidth detection circuit that processes the envelope signal to generate a detected bandwidth signal, and a mode control circuit that controls a mode of the envelope tracker based on the detected bandwidth signal. In some cases, the detected bandwidth signal may indicate the detected bandwidth of the envelope signal 104 (also referred to as "detected signal bandwidth") that is the signal bandwidth of the radio frequency signal 103. In some such cases, the bandwidth signal may be associated with a number of resource blocks (RBs) used by the radio frequency signal 103.

By controlling a mode of the envelope tracker 2 based on the detected signal bandwidth (indicated by the detected bandwidth signal), an overall efficiency of the envelope tracker can be increased (as described above with respect to FIG. 6B). In certain implementations, an RF signal includes signal content corresponding to one or more resource blocks (RB), and the mode of the envelope tracker is selected based on the number of detected resource blocks.

In one embodiment, the envelope tracker 2 includes a multi-output boost switcher for generating regulated voltages of different voltage levels, switches for controlling selection of a suitable regulated voltage based on the envelope signal, and a filter for filtering the output of the switches to generate the power amplifier supply voltage. Additionally, a filtering characteristic of the filter is controlled based on the detected signal bandwidth.

In another embodiment, the envelope tracker includes a DC-to-DC converter that operates in combination with an error amplifier to generate a power amplifier supply voltage based on an envelope signal. Additionally, the error amplifier is controlled based on the detected signal bandwidth.

In one example, when the detected signal bandwidth is low (for instance, when relatively few resource blocks are used by the radio frequency signal), the error amplifier is disabled to increase power efficiency of the power amplifier 3 (or power amplifier 32). In another example, when the detected signal bandwidth is intermediate (for instance, a moderate number of resource blocks are used), the error amplifier bias current is reduced to conserve power. In a third example, when the detected signal bandwidth is relatively high (for instance, a large number of resource blocks are used), the error amplifier and the DC-to-DC converter operate in parallel to generate the power amplifier supply voltage.

Thus, in certain implementations an error amplifier can be disabled and/or a bias of an error amplifier can be controlled to reduce power consumption when the detected signal bandwidth is less than a maximum.

Figure 7:
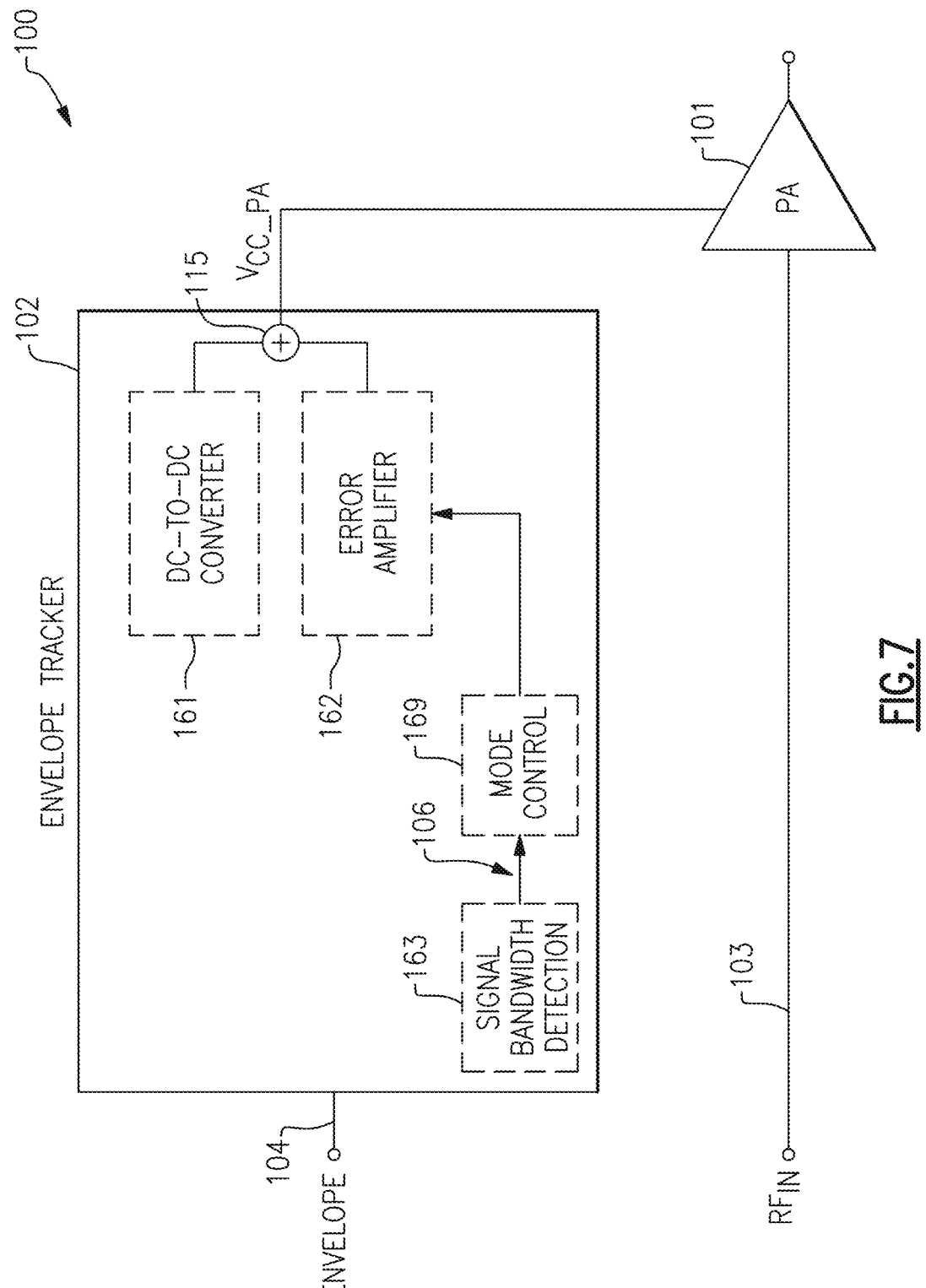
FIG. 7 is a schematic diagram of a power amplifier system controlled by an envelope tracker according to one embodiment.

FIG. 7 is a schematic diagram of a power amplifier system 100 according to one embodiment. The power amplifier system 100 includes a power amplifier 101 and an envelope tracker 102. The power amplifier 101 provides amplification to a radio frequency signal 103.

The envelope tracker 102 of FIG. 7 illustrates one embodiment of an envelope tracker that operates with automatic mode selection. However, the teachings herein are applicable to envelope trackers implemented in a wide variety of ways. Accordingly, other implementations are possible.

The envelope tracker 102 receives an envelope signal 104 corresponding to an envelope of the radio frequency signal

103. Additionally, the envelope tracker 102 generates a power amplifier supply voltage $V_{CC\_PA}$, which supplies power to the power amplifier 101.

The illustrated envelope tracker 102 includes a DC-to-DC converter 161 and an error amplifier 162 that operate in combination with one another to generate the power amplifier supply voltage $V_{CC\_PA}$ based on the envelope signal 104. In the illustrated embodiment, an output of the DC-to-DC converter 161 and an output of the error amplifier 162 are combined using a combiner 115. The envelope tracker 102 further includes a signal bandwidth detection circuit 163 that processes the envelope signal 104 to detect a signal bandwidth of the radio frequency signal 103 (e.g., a bandwidth of an envelope of the radio frequency signal 103). Additionally, the envelope tracker 102 includes the mode control circuit 169, which processes the detected signal bandwidth to control a mode of the error amplifier 162.

In one embodiment, the signal bandwidth detection circuit 163 detects the signal bandwidth of the radio frequency signal 103 based on determining a number of resource blocks (RBs) used by the radio frequency signal 103. However, other implementations are possible. The signal bandwidth detection circuit 163 generates a detected bandwidth signal 106 that indicates the bandwidth of the envelope signal 104 (also referred to as "the detected signal bandwidth of the radio frequency signal 103" or "the detected signal bandwidth"). In some cases, the bandwidth signal 106 may comprise a number of resource blocks associated with the signal bandwidth.

In some embodiments, the mode control circuit 169 may process the detected bandwidth signal 106 to determine a number of resource blocks used by the radio frequency signal. In some such embodiments, the mode control circuit 169 may use the number of resource blocks to control the mode of the error amplifier 162.

The mode control circuit 169 controls a mode of the envelope tracker 102 to one of multiple different modes. The modes are suitable for processing envelope signals of different bandwidths. Thus, the envelope tracker 102 can be operated in a mode that is power efficient with respect to a given signal bandwidth.

In certain configurations, the mode control circuit 169 disables the error amplifier 162 when the detected signal bandwidth is less than a first threshold bandwidth. Thus, when the detected signal bandwidth is relatively low, the DC-to-DC converter 161 generates the power amplifier supply voltage $V_{CC\_PA}$.

Disabling the error amplifier 162 when the detected signal bandwidth is relatively low increases power efficiency, since the DC-to-DC converter 161 tracks low frequency components of the envelope signal 104 with greater efficiency relative to the error amplifier 162.

However, when the detected signal bandwidth is relatively high, such as when the detected signal bandwidth is greater than a second threshold bandwidth, the DC-to-DC converter 161 and the error amplifier 162 can operate in parallel with one another to control the power amplifier supply voltage $V_{CC\_PA}$. The combination of the DC-to-DC converter 161 and the error amplifier 162 can provide envelope tracking of wide bandwidth envelope signals, since the DC-to-DC converter 161 can provide superior tracking of low frequency components of the envelope signal 104 while the error amplifier 162 can provide superior tracking of high frequency components of the envelope signal 104. In some cases, the first or the second threshold bandwidth can be the marginal frequency components of the envelope signal 104 above which the DC-to-DC converter may not function or may be disabled.

In one embodiment, when the detected signal bandwidth is greater that the first threshold bandwidth but less than the second threshold bandwidth the control circuit decreases a bias current of the error amplifier 162. For example, the mode control circuit 169 can include one or more intermediate power modes used to generate the power amplifier supply voltage $V_{CC\_PA}$ with higher efficiency while operating the error amplifier 162 at a backed-off power level appropriate for a given signal bandwidth In one embodiment, when the detected signal bandwidth is greater that the first threshold bandwidth but less than the second threshold bandwidth, the DC-to-DC converter 161 and the error amplifier 162 operate in parallel with one another, and the mode control circuit 169 may decrease a bias current of the error amplifier 162.

In some embodiments, the mode control circuit 169 may control a mode of a multi-level switching circuit of the envelope tracker 102. In some cases, the mode control circuit 169 controls a filtering characteristic of the multi-level switching circuit based at least in part on the detected bandwidth signal 106 bandwidth received from the signal bandwidth detection circuit 163. For examples, the mode control circuit 169 controls may control a filter bandwidth and/or a cutoff frequency of the multi-level switching circuit. In some other cases, the mode control circuit 169 controls a state of the multi-level switching circuit based at least in part on the detected bandwidth signal 106 received from the signal bandwidth detection circuit 163.

When the detected signal bandwidth (bandwidth of the envelope signal) is relatively low, such as when the radio frequency signal $RF_{IN}$ includes signal components of a relatively small number of resource blocks, the shaping and control circuit 164 may disable the error amplifier 162 using the amplifier control signal 164*b* (or the multi-level switching circuit).

Power Amplifier System with Adaptive Envelope Tracker Slew Rate

Figure 8A:
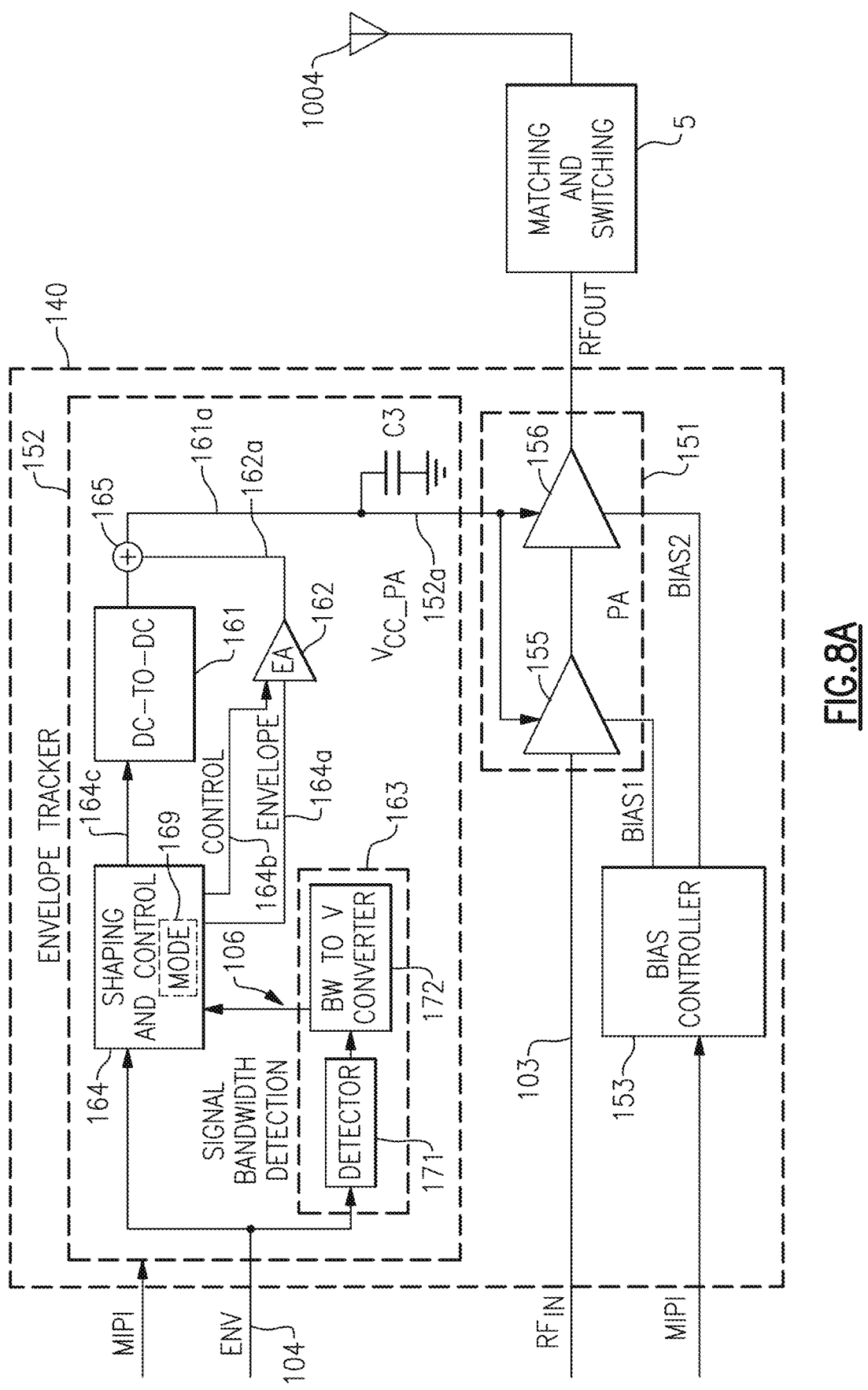
FIG. 8A is a schematic diagram of a power amplifier system with an adaptive ET system according to one embodiment.

FIG. 8A is a schematic diagram of a power amplifier system 140 capable of adaptively controlling a slew rate of the amplifier 151 according to certain embodiments. The power amplifier system 140 may include a power amplifier (PA) 151 that receives an input RF signal ($RF_{IN}$) 103 and outputs an amplified RF signal ($RF_{OUT}$), and an envelope tracker (ET) 152 that provides supply voltage 152*a* to the PA 151. As described above, the supply voltage 152*a* provided by the ET 152 may be adaptively adjusted, for example, to improve the power efficiency of the PA 151 when generating the amplified signal ($RF_{OUT}$). The ET 152 may generate the supply voltage 152*a* based on a bandwidth of a received envelope signal 104 corresponding to the envelope of the input RF signal 103. In some embodiments, the ET 152 may generate the supply voltage 152*a* based on a number of resource blocks associated with the received envelope signal 104. The envelope signal 104 may be generated using a baseband signal received from the baseband processor 7, for example, according to the method and configuration described with respect to FIG. 4. In some cases, the power amplifier 151 can be a multi-stage power amplifier that includes two or more stages connected in cascade. In the example shown, the power amplifier 151 includes a first stage 155 and a second stage 156. The first stage 155 receives $RF_{IN}$ 103 and feeds a first amplified signal to a second stage 156 and the second stage 156 outputs $RF_{OUT}$.

In some embodiments, the envelope tracker 152 may comprise one or more features described with respect to envelop tracker 102.

The power amplifier system 140 may further comprise a bias controller 153 that provides one or more bias signals to the one or more stages of the power amplifier 151. In the example shown, the bias controller 153 generates a first bias signal BIAS1 for the first stage 155 of the power amplifier 151, and a second bias signal BIAS2 for the second stage 156 of the power amplifier 151. The first bias signal BIAS1 and the second bias signal BIAS2 can include a bias current, a bias voltage, or a combination thereof.

The envelope tracker 152 includes, a signal bandwidth detection circuit 163, an error amplifier (EA) 162 (also referred to as linear amplifier or LA), a shaping and control circuit 164 and a DC-to-DC converter 161 (e.g., a switcher). In some implementations, the envelope signal 104 received by the ET 152 is divided between the shaping and control circuit 164 and the signal bandwidth detection circuit 163. The signal bandwidth detection circuit 163 generates a detected bandwidth signal 106 (e.g., a bandwidth voltage) based on a detected bandwidth of the envelope signal 104 and feeds the detected bandwidth signal 106 to the shaping and control circuit 164. In some examples, the signal bandwidth detection circuit 163 includes a root mean square (RMS) detector 171 and an envelope bandwidth-to-voltage (BW To V) converter 172. In some examples, the signal bandwidth detection circuit 163 detects the bandwidth of the envelope signal 104 based on determining a number of resource blocks (RBs) used by the RF input ($RF_{IN}$) signal 103 using the envelope signal 104. In some such examples, the detected bandwidth signal 106 may comprise a number of resource blocks associated with the envelope signal 104 or the corresponding RF signal. In some other examples, the detected bandwidth signal 106 may be usable for determining the number of resource blocks associated with the envelope signal 104 or the corresponding RF signal. However, other implementations are possible.

The RMS detector 171 generates a detection signal, indicative of an RMS value of the envelope signal ENV, and the envelope bandwidth to voltage converter 172 processes the detection signal to generate an output voltage that changes based on the signal bandwidth detected by processing the envelope signal ENV.

As shown in FIG. 8A, the signal bandwidth detection circuit 163 may provide the detected bandwidth signal 106 to a mode control circuit 169 of the shaping and control circuit 164. The illustrated embodiment includes a mode control circuit 169 integrated with the shaping and control circuit 164. The mode control circuit 169 processes the detected bandwidth signal 106 to select an operating mode of the envelope tracker 152. In some cases, the shape and mode control circuit 164 may process the detected bandwidth signal 106 to determine a number of resource blocks used by the corresponding RF signal. The shaping and control circuit 164 generates and provides a first shaped envelope signal 164a to the error amplifier 162 and a second shaped envelope signal 164c to the DC-to-DC converter 161. In some examples, the first shaped envelope signal 164a and the second shaped envelope signal 164c can be the same or different shaped envelope signals.

The mode control circuit 169 further generates and provides an amplifier control signal 164b to the error amplifier 162. The mode control circuit 169 may generate the amplifier control signal 164b, based at least in part on the detected bandwidth signal 106, a signal bandwidth indicated by the detected bandwidth signal 106, or a number of resource blocks determined using the detected bandwidth signal 106. In some cases, the mode control circuit 169 may control a bias of the error amplifier 162. For example, the control signal 164b may be a bias voltage/current provided to the error amplifier 162 or a signal usable for controlling a bias voltage/current. In some cases, the amplifier control signal 164b may control a mode of operation of the error amplifier 162. In some cases, the amplifier control signal 164b may comprise a first amplifier control signal that controls a mode of operation of the error amplifier 162 and a second amplifier control signal that controls the bias of the error amplifier 162. In yet other cases, the amplifier control signal 164b may comprise a slew rate control signal configured to control a slew rate of the error amplifier 162. The error amplifier 162 generates an output 162a (e.g., a supply voltage) based at least in part on the amplifier control signal 164b and the first envelope signal 164a. In some cases, the mode control circuit 169 may also generate and provide a control signal to the DC-to-DC converter 161.

In certain implementations, the mode control circuit 169 disables the error amplifier 162 when the detected number of resource blocks is less than a first amount. Thus, when the detected number of resource blocks is relatively low, the DC-to-DC converter 161 generates the power amplifier supply voltage $V_{CC\_PA}$. In some cases, the first amount may correspond to the first threshold bandwidth.

However, when the detected signal envelope bandwidth is relatively high, such as when the bandwidth is larger than a second threshold bandwidth or the determined/detected number of resource blocks is greater than a second amount, the DC-to-DC converter 161 and the error amplifier 162 may operate in parallel with one another to control the power amplifier supply voltage $V_{CC\_PA}$. In some cases, the second amount may be associated with the second threshold bandwidth.

In one embodiment, when the detected number of detected resource blocks is greater that the first amount but less than the second amount, the DC-to-DC converter 161 and the error amplifier 162 operate in parallel with one another, and the mode control circuit 169 decreases a bias current of the error amplifier 162. For example, the mode control circuit 169 can include one or more intermediate power modes used to generate the power amplifier supply voltage $V_{CC\_PA}$ with higher efficiency while operating the error amplifier 162 at a backed-off power level appropriate for a given number of resource blocks being used by the radio frequency signal $RF_{IN}$.

In some implementations, the error amplifier 162 operates in combination with the DC-to-DC converter 161 to generate the supply voltage 152a (the PA supply voltage or $V_{cc\_PA}$). As shown in FIG. 8A, the DC-to-DC converter 161 and the error amplifier 162 can be electrically connected in parallel with one another and their outputs (161a and 162a) may be combined via a combiner 165 (e.g., an AC combiner) and provided as the supply voltage 152a to the PA 151. In such implementations, the DC-to-DC converter 161 can track low frequency components of the envelope signal 104 while the error amplifier 162 can track high frequency components of the envelope signal 104. For example, the switching frequency of the DC-to-DC converter 161 can be reduced to be less than a maximum frequency component of the envelope signal 104, and the error amplifier 162 can operate to smooth gaps in the DC-to-DC converter's output to generate the supply voltage 152a to the power amplifier 151. As a result, the combination of the switcher 161 and the error amplifier 162 can provide envelope tracking of wide bandwidth envelope signals.

In some examples, a capacitor (C3) may be used to terminate the output of the combiner 165. In some cases, this capacitor (C3) may improve the linearity of the PA 151 by bypassing the noise (e.g., high frequency noise) and to add stability to the PA 151.

The power amplifier 151 may be controlled via a serial interface, such as a Mobile Industry Processor Interface (MIPI) interface. For example, the serial interface may communicate with the power amplifier 151 and may be used to control the biasing of the power amplifier 151. In certain configurations, the serial interface may be used to provide data to the envelope tracker, such as data identifying operating mode, operating band, and/or characteristics of the radio frequency signal $RF_{IN}$.

As shown, the amplified RF signal ($RF_{OUT}$), generated by the amplifier system 140, may be delivered to one or more antennas 1004 via a matching and switching circuit 5. The matching and switching circuit may include one or more matching circuits configured to match an output impedance of the PA 151 to the input impedance of the one or more antennas 1004.

Figure 8B:
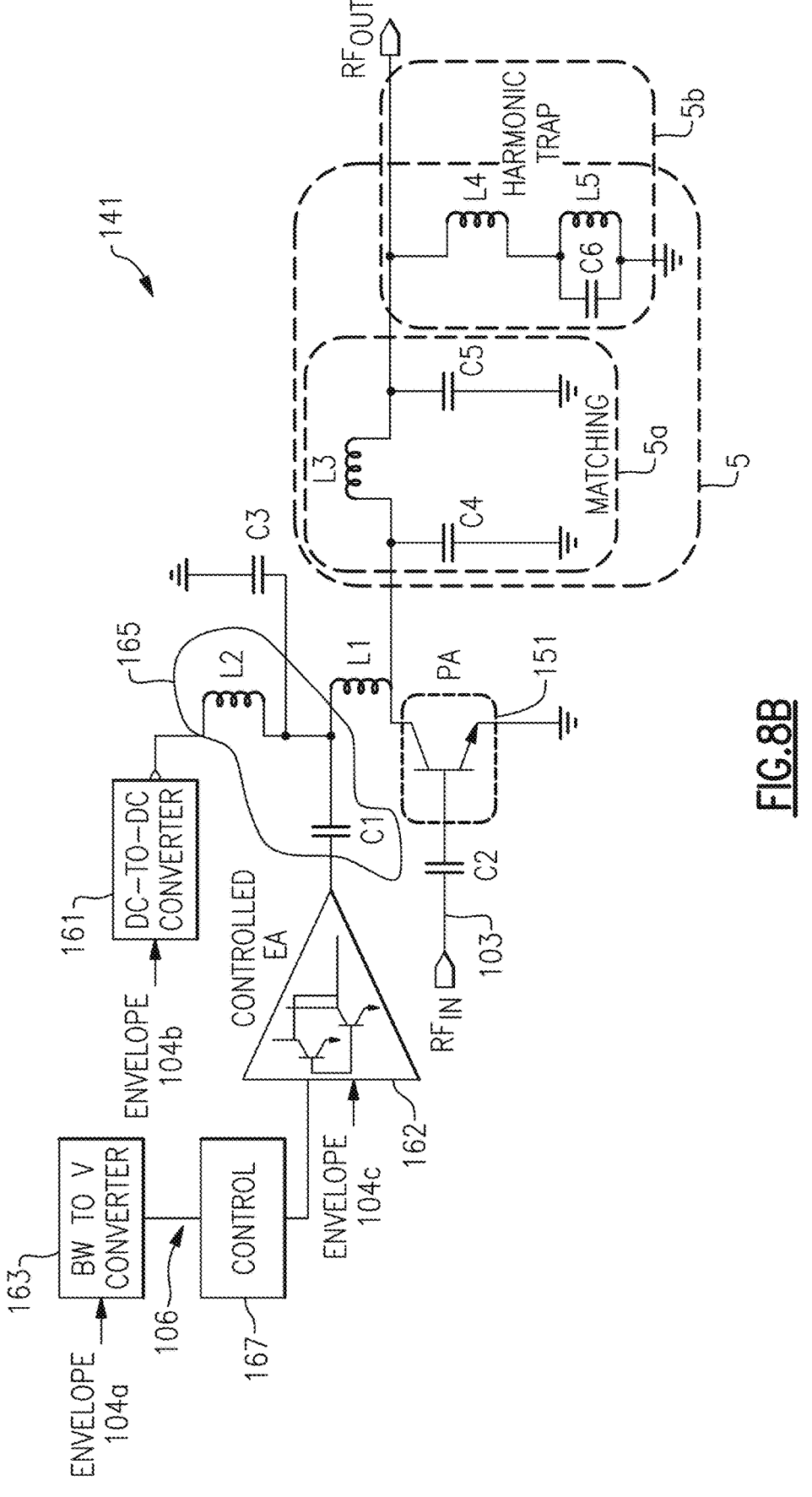
FIG. 8B is a schematic diagram of a power amplifier system with an adaptive ET system according to another embodiment.

FIG. 8B is a schematic diagram a power amplifying system 141 according to one embodiment. The power amplifying system 141 may be an example implementation of the power amplifier system 140 where the PA 151 comprises a single stage power amplifier. In this example, the PA 151 includes a bipolar transistor having an emitter, a base, and a collector and the emitter is electrically connected to a ground supply. An RF signal ($RF_{IN}$) 103 is provided to the base of the bipolar transistor via a capacitor C2, and the bipolar transistor amplifies the RF signal to generate an amplified RF signal at the collector. In various embodiments, the bipolar transistor can be any suitable device. In one implementation, the bipolar transistor is a heterojunction bipolar transistor (HBT).

Similar to the PA 151 of the power amplifier system 140 of FIG. 8A, the supply voltage of the PA 151 of FIG. 8B is adaptively provided by an error amplifier and a DC-to-DC converter. In various embodiments the supply voltage can be provided based at least in part on an envelope signal 104 corresponding to the RF input signal ($RF_{IN}$) 103 and a detected bandwidth signal 106 associated with a bandwidth of the envelope signal 104. In some cases, a first envelope signal 104a is provided to the bandwidth detection circuit 163 (e.g., a bandwidth-to-voltage converter) a second envelope signal 104b to the DC-to-DC downconverter 161 (e.g., a switcher), and a third envelope signal 104c to the error amplifier 162 (e.g., a linear amplifier). In some such cases, the first envelope signal 104a, the second envelope signal 104b, and the third envelope signal 104c, are portions of the envelope signal 104. In some other cases, the envelope signal 104a comprises the envelope signal 104, and the second envelope signal 104b and the third envelope signal 104c are shaped envelope signal generated by a shaping and control circuit (e.g., shaping and control circuit 164).

The DC-to-DC converter generates a first supply voltage using the second envelope signal 104b and the error amplifier 162 generates a second supply voltage using the third envelope signal 104c. The first and the second supply voltages are combined using an AC combiner 165 and the combined supply voltage is delivered to the PA 151 (e.g., to the collector of the corresponding bipolar transistor) via an inductor L1. In some examples, the AC combiner 165 may include a capacitor C1 connected to an output of the error amplifier 162 and an inductor L2 connected to an output of the DC-to-DC converter 161. The inductor L2 may eliminate the high frequency signal components output by the DC-to- DC converter 161 and the capacitor C1 may eliminate the low-frequency signal components of output by the error amplifier 162. The signals transmitted via the capacitor C1 and the inductor L2 are combined in a junction where C1 and L2 are electrically connected to each other and to the inductor L1. In some examples, a capacitor C3 may provide a path to ground from the junction between C1, L2 and L1.

The bandwidth detection circuit 163, generates the detected bandwidth signal 106 (e.g., a bandwidth voltage corresponding to the bandwidth of the envelope signal 104) and provides the detected bandwidth signal 106 to a controller 167 that generates an amplifier control signal and transmits the amplifier control signal to a control port of the error amplifier 162. In some cases, the controller 167 may be included in the shaping and control circuit 164. As descried above, in some examples, the amplifier control signal may enable or disable the error amplifier 162 based at least in part on the bandwidth signal 106 received from the bandwidth detection circuit 163. In some such examples, the amplifier control signal may be configured to disable the error amplifier 162 when the bandwidth of the envelope signal 104 (indicated by the bandwidth signal 106) is less than a first threshold bandwidth or when the detected number of resource blocks (e.g., determined using bandwidth signal 106) is lower than a first amount. As a result, the combination of the BW-to-Voltage converter 163, the controller 167, the DC-to-DC converter 161 and the combiner 165, serve as an envelope tracker that provides an adaptive supply voltage to the PA 151 based on the amplitude and bandwidth of the envelope signal 104. Advantageously, by adaptively adjusting the supply voltage to the PA 151 based on the envelope signal 104 (e.g., based on amplitude and/or the bandwidth of the envelope signal), the envelope tracker may reduce the power consumption of the PA 151 while providing sufficient supply voltage to support amplification of the RF input signals that may have envelopes with time-dependent amplitude and frequencies.

The impedance matching circuit 5 serves to terminate the output of the power amplifier 151, which can aid in increasing power transfer from the PA 151 to a circuit or device that receives the amplified RF signal (e.g., an antenna). In the example shown, the impedance matching circuit 5 includes a pi-filer 5a and a harmonic trap 5b. The pi-filter includes a first capacitor C4 (a shunt capacitor) in the input side, a second capacitor C5 in the output side and a first inductor L3 between C4 and C5. The harmonic trap 5b includes a first inductor L4 connected in series with a low-pass LC filter comprising a second inductor L5 and a capacitor C6 connected in parallel with the second inductor L5.

Adaptive Envelope Tracker Error Amplifier Slew Rate

In various embodiments, a slew rate of the error amplifier (e.g., the error amplifier 162) used in an envelope tracker (e.g., envelope tracker 1060, 2, 102, or 152), may limit the performance of the power amplifier (e.g., power amplifier 3, 32, 101, 151, or a power amplifier of the power amplifiers 1011,) that receives its supply voltage from the envelope tracker (ET). For example, when the bandwidth of the envelope signal 104 is relatively large (e.g., when the envelope signal is associated with an RF signal of a 5G wireless system), the slew rate of the error amplifier (EA) may not allow the envelope tracker to supply a voltage required to amplify the RF input signal, when the corresponding envelope signal varies at a high rate (large bandwidth). While reducing the capacitance of the capacitor that terminates the output of the error amplifier (e.g., capacitor C3) may effectively increase the slew rate of the error amplifier, a low terminating capacitance may adversely affect the performance of the ET at lower frequencies. In order for the power amplifier (PA) to amplify RF input signals having a wide range of envelope bandwidths, the slew rate of the error amplifier according to certain embodiments should be adjusted adaptively to accommodate both high and low bandwidth envelope signals.

In some implementations, the slew rate of the error amplifier may be adaptively adjusted by a changing a biasing of the error amplifier (e.g., a bias voltage or a bias current provided to EA by the envelope tracker) or a number of active biasing stages in the EA. For example, the biasing of the EA may be increased for envelope bandwidths (detected signal bandwidths) larger than a slew control bandwidth threshold and decreased for envelope bandwidths smaller than a slew control bandwidth threshold. In some cases, the slew rate of the error amplifier may be changed continuously proportional to the detected signal bandwidth. For a given envelope tracking system, the slew control bandwidth threshold may be a predetermined value selected or programmed at the time of manufacturing. In some cases, the slew control bandwidth threshold is a dynamically controlled value. For example, the shaping and control circuit 164 may adjust the slew control bandwidth threshold based on characteristics of an output of the power amplifier 151 RF$_{OUT}$ or a measured value of the power consumption of the power amplifier 151.

In some other implementations, the slew rate of the error amplifier may be adaptively adjusted by changing a number of amplifying components or amplifying stages (e.g., active amplifying stages) within the error amplifier. For example, when the bandwidth of the envelope signal is large (e.g., larger than the slew control bandwidth threshold), the additional amplifying stages may be enabled within the error amplifier to support amplification of a high bandwidth envelope signal. In these implementations, the adaptive adjustment of the EA's slew rate, may result in improved performance of the ET 152 and therefore the PA 151 for both narrow and wide bandwidth signals.

In some embodiments, the slew rate of the error amplifier 162 may be controlled using a slew rate control signal generated by a control circuit (e.g., the shaping and control circuit 164 in power amplifier system 140 or the control circuit 167 in power amplifying system 141) based at least in part on the bandwidth of the envelope signal. In some such embodiments, the control circuit controls the slew rate of the error amplifier 162 based on a comparison between the bandwidth of the envelope signal and a slew control bandwidth threshold. For example, control circuitry may increase the slew rate if the bandwidth of the envelope signal is greater than the slew control bandwidth threshold, or may decrease the slew rate if the bandwidth of the envelope signal is smaller than the slew control bandwidth threshold.

In some embodiments, the control circuit (e.g., the shaping and control circuit 164 of FIG. 8A or the control circuit 167 of FIG. 8B) may control the slew rate of the error amplifier 162 based at least in part on a number of resource blocks used by the RF signal (or associated with the envelope signal). In some such embodiments, the control circuit controls the slew rate of the error amplifier 162 based on a comparison between the number of resource blocks and a slew control resource block amount. For example, the control circuit may increase the slew rate if the number of resource blocks is greater than the slew control resource block amount, or may decrease the slew rate if the number of resource blocks is smaller than the slew control resource block amount. In various embodiments, the number of resource blocks may be determined by the bandwidth detection circuit 163 using the envelope signal 104 or by the shaping and mode control circuit 164 using the bandwidth signal 106.

The slew rate control signal may increase or decrease the slew rate of the error amplifier 162 by controlling the biasing (e.g., a number of active biasing stages in the error amplifier or the bias current/voltage provided to the error amplifier), or a number of active amplifying stages used in the error amplifier 162 to provide a supply voltage to the power amplifier 151.

In some cases, the control circuit may control the slew rate of the error amplifier 162 based on a comparison between the detected signal bandwidth and one or more slew control bandwidth thresholds. For example, the slew rate of the error amplifier 162 may change stepwise (e.g., by changing a number of the amplifying stages of the EA or number of active biasing stages providing bias currents to the error amplifier 162), as the detected signal bandwidth changes from a first bandwidth range defined by a first slew control bandwidth threshold and a second slew control bandwidth threshold, to a second bandwidth range defined by the second slew control bandwidth threshold and a third slew control bandwidth threshold.

In some other implementations, the slew rate control signal control signal generated by the control circuit (e.g., the shaping and control circuit 164 of FIG. 8A or the control circuit 167 of FIG. 8B) may adaptively adjust the slew rate of the error amplifier 162 by both changing a number of amplifying stages (e.g., active amplifying stages) within the error amplifier and also changing a biasing of one or more amplifying stages.

It will be appreciated that there is a tradeoff between the slew rate and the efficiency of the error amplifier 162. While a faster slew rate improves the frequency response of the error amplifier 162 and therefore the quality of the amplification provided by the PA 151 (biased by the error amplifier 162) for high bandwidth RF signals, in most cases, it may reduce the efficiency of the error amplifier 162. As such, adjusting the slew rate according to the bandwidth of the corresponding envelope signal may avoid the unnecessary low efficiency that may result from using a fast slew rate for low bandwidth envelope signals and poor performance (e.g., signal distortion) associated with using a slow slew rate for large bandwidth envelope signals.

Figure 9:
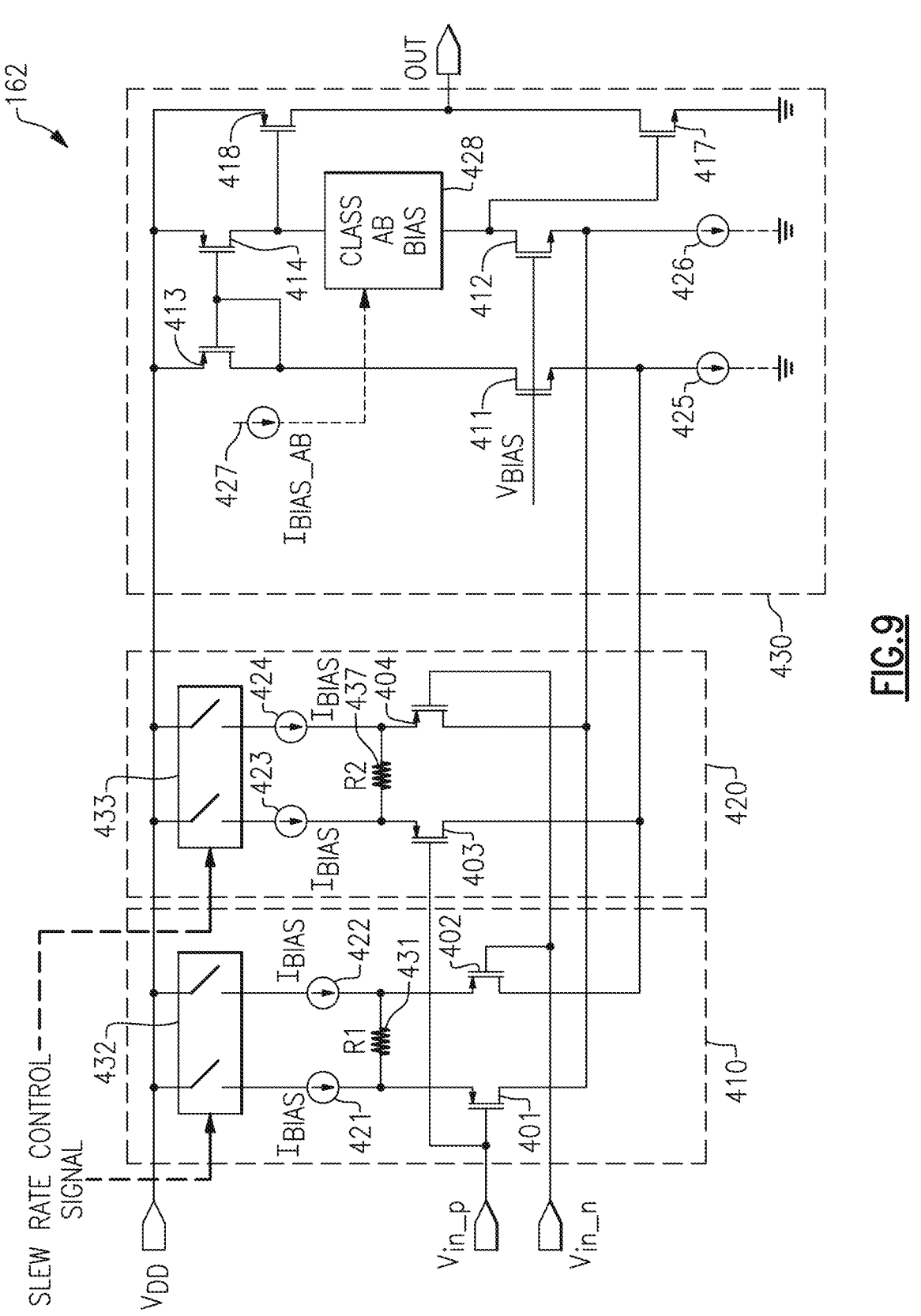
FIG. 9 is a schematic diagram of an error amplifier with adaptive slew rate control according to one embodiment.

FIG. 9 is a schematic diagram of one embodiment of an adaptively biased error amplifier 162 that supports adaptive biasing of an amplification stage based on a detected signal bandwidth or a number of resource blocks associated with the envelope signal 104 (e.g., indicated by the detected bandwidth signal 106). The error amplifier 162 is a differential amplification circuit. Although one example of a suitable differential amplification circuit is shown, an adaptively biased differential amplifier may be implemented in a wide variety of ways. In various implementations, the error amplifier 162 may include one or more controllable biasing stages that control the slew rate of the error amplifier 162 by controlling the bias (e.g., the bias current) provided to the error amplifier 162 (e.g., to an amplifying stage of the error amplifier 162). In some cases, the slew rate control signal may control the one or more controllable biasing stages. In some embodiments, the error amplifier 162 incudes a plurality of amplifying stages where one or more amplifying stages may also function as controllable biasing stages. These controllable amplifying/biasing stages, herein referred to as biasing stages, may control a slew rate of the one or more amplifying stages (e.g., subsequent amplifying stages), by adjusting the bias (e.g., a bias voltage or bias current) of the one or more amplifying stages.

As shown in FIG. 9, the differential amplification circuit 162 includes a first amplifying/biasing stage or biasing stage 410, a second amplifying/biasing or biasing stage 420 and a third amplifying stage 430. The first biasing stage 410 and the second biasing stage 420 are individually controlled stages that control the slew rate of the differential amplification circuit 162 by controlling the bias currents provided to the amplifying stage 430. The first biasing stage 410 is controlled by a first slew rate switch 432 and the second biasing stage 420 is controlled by a second slew rate switch 433.

In some examples, the shaped envelope signal (e.g., the shaped envelope signal 164a provided by the shaping and control circuit 164) may be a provided to the first biasing stage 410 and the second biasing stage 420 as a differential input Vin_p, Vin_n.

The first biasing stage 410 includes a first pair of p-type field effect transistors (PFETs) 401-402 for amplifying the differential input Vin_p, Vin_n, for example, corresponding to the envelope signal 164a. The first pair of PFETs 401-402 is biased by a first pair of current sources 421-422 (each providing a current $I_{BIAS}$ to the corresponding PFET, in this example), and includes a first resistor 431 of resistance R1 for coupling the source of the PFET 401 to the source of the PFET 402. The first pair of current sources 421-422 may be enabled or disabled using the first slew rate switch 432 that may be controlled by the slew rate control signal. The slew rate control signal can be generated by the shaping and control circuit 164 (in the amplifier system 140) or the signal bandwidth detection circuit 163. For example, the amplifier control signal 164b may comprise the slew rate control signal. In some cases, the detected bandwidth signal 106 may be provided to the first slew rate switch 432 of the EA 162 as the slew rate control signal.

The second stage 420 includes a second pair of p-type field effect transistors (PFETs) 403-404 for amplifying the differential input Vin_p, Vin_n. The second pair of PFETs 401-402 is biased by a second pair of current sources 423-424 (each providing a current $I_{BIAS}$ to the corresponding PFET, in this example), and includes a second resistor 437 of resistance R2 for coupling the source of the PFET 403 to the source of the PFET 404. The second pair of current sources 423-424 may be enabled or disabled using the second slew rate switch 433 that may be also controlled by the slew rate control signal described above. In some cases, the detected bandwidth signal 106 may be provided to the second slew rate switch 433 of the EA 162 as the slew rate control signal.

Each of the slew rate switches 432 and 433, may include a pair of electronically controlled switches used to enable or disable the first pair of current sources 421-422 or the second pair of current sources 423-424 provided to the first pair of PFETs 401-402 and the second pair of PFETs 403-404 respectively. The slew rate switches 432 and 433, may be controlled based at least in part on a bandwidth of the envelope signal, for example, indicated by the detected bandwidth signal or the amplifier control signal 162b.

Current from the first pair of PFETs 401-402 and the second pair of PFETs 403-404 are combined using folded cascode circuitry that includes current sources 425-426, n-type field effect transistors (NFETs) 411-412, and PFETs 413-414. In this example, the gates of NFETs 411-412 are controlled by a bias voltage VBIAS. In some cases, VBIAS is a constant voltage provided by a voltage supply.

The differential amplification circuit 162 further includes a push-pull output stage including NFET 417, PFET 418, a current source 427, and a class AB bias circuit 428. As shown in FIG. 9, the current source 427 provides a current $I_{BIAS\_AB}$ to the class AB bias circuit 428, which biases the NFET 417 and PFET 418 to provide enhanced bandwidth.

The differential amplification circuit 162 may be adaptively controlled using the first slew rate switch 432 and the second switch 433 based on the slew rate control signal. In some cases, the slew rate control signal may be associated with the bandwidth of the envelope signal 104 or a number of resource blocks used by the corresponding radio frequency signal. In such cases, the slew rate of the third amplifying stage 430 and therefore that of the differential amplification circuit 162 may be increased for envelope signals having larger bandwidths (e.g., larger than a slew rate control bandwidth) by enabling both the first pair of current sources 421-422 and the second pair of current sources 423-424 using the slew rate switches 432 and 433. Correspondingly, the slew rate of the third amplifying stage 430 and therefore that of the differential amplification circuit 162 may be decreased for envelope signals having smaller bandwidths (e.g., smaller than the slew rate control bandwidth) by disabling one of current sources (421-422 and 423-424) using the slew rate switches 432 and 433. In some cases, the slew rate control signal turns off the EA 162 by disabling both slew rate switches 432/433. As such, the slew rate control signal may control both the slew rate and the ON/OFF state of the EA based on the detected signal bandwidth (or corresponding number of resource blocks).

If the detected signal bandwidth of the envelope signal is larger than the slew control bandwidth threshold or a number of resource blocks associated with the envelope signal is greater than the slew control resource block amount, the amplifier control signal 164b may enable both the first pair of current sources 421-422 and the second pair of current sources 423-424 (e.g., using the slew rate switches 432 and 433) to increase the slew rate of the EA. In some cases, the detected signal bandwidth or the number of resource blocks are indicated by the detected bandwidth signal 106 generated by the signal bandwidth detection circuitry 163. In some cases, the number or resource blocks (RBs) is determined by the shaping and mode control circuit 164 using the detected bandwidth signal 106. For example, a voltage associated with the detected bandwidth signal 106 may indicate the number of RBs. The relation between the voltage and number of RBs can be a characteristic of the bandwidth-to-voltage converter 172.

In various embodiments, an EA may comprise 3, 4 or more individually controlled biasing stages. In some cases, each biasing stage may be activated or deactivated by a control circuit (e.g., the shaping and control circuit 164) using separate slew rate switches. In some cases, each biasing stage may be continuously controlled by the control circuit to adjust a bias current provided to the EA (e.g., the amplifying stage of the EA). In these cases, the slew rate of the EA may be continuously adjusted based on the detected bandwidth of the envelope signal.

Figure 10:
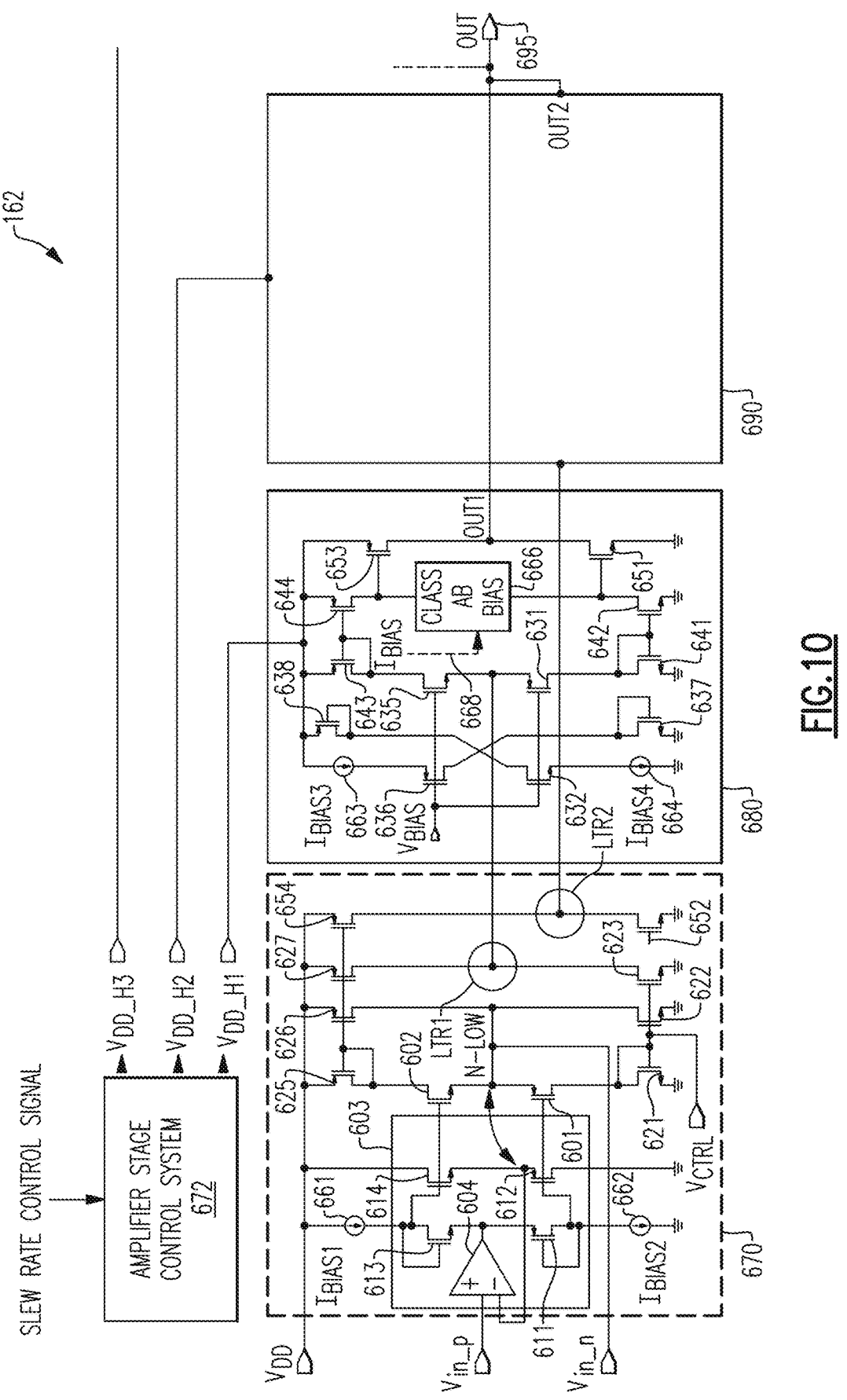
FIG. 10 is a schematic diagram of an error amplifier with adaptive slew rate control according to another embodiment.

FIG. 10 is a schematic diagram of an example error amplifier circuit 162 that supports adaptive control of slew rate based on controlling number of amplifying stages employed in the amplification process. The error amplifier 162 may comprise a multi-stage high bandwidth differential amplification circuit. Although one example of a suitable differential amplification circuit is shown, a high bandwidth amplifier can include amplification circuitry implemented in a wide variety of ways.

The example shown, is a three-stage error amplifier comprising amplification stages 670/680/690 connected in series. In some cases, the error amplifier circuit 162 may include any number of amplifying stages (e.g., 3, 4, 10, 20). In some such cases, the first amplifying stage may be a primary amplifying stage and the other amplifying stages may be controllable amplifying stages (herein referred to as amplifying stages). The bias voltage $V_{DD}$ provided to the primary stage may be constant while the bias voltage provided to the amplifying stages 680/690 may be controlled by an amplifier stage control system 672. The amplifier stage control system 672 may control the slew rate of the amplifier circuit 162 by activating or deactivating the amplifying stages 680/690. In some cases, including more amplifying stages used in the amplification process increases the slew rate of the amplifier circuit 162. The amplifier stage control system 672 may control the number of active amplifying stages contributing in the amplification process (e.g., by controlling the corresponding supply voltages) using the slew rate control signal based at least in on part on the bandwidth of the envelope signal (the detected signal bandwidth) or a number of resource blocks used by the corresponding RF signal. For example, for bandwidths larger than a slew control bandwidth threshold, the control signal may add one or more amplifying stages to the amplification process and for bandwidths smaller than the slew control bandwidth threshold the control signal may deactivate one or more amplifying stages (e.g., by turning off the corresponding supply voltages).

Correspondingly, if the number of resource blocks are larger than a slew control resource block amount, the control signal may add one or more amplifying stages to the amplification process and if the number of resource blocks is smaller than the slew control resource block amount, the control signal may deactivate one or more amplifying stages (e.g., by turning off the corresponding supply voltages).

In some implementations, the number of active amplifying stages is controlled by switching the supply voltages $V_{dd\_h1}$, $V_{dd\_h2}$ and $V_{dd\_h3}$ provided to each amplifying stage. For example, the amplifier stage control system 672 may activate or deactivate one or more amplifying stages of the error amplifier 162 based at least in part on the bandwidth of the received envelope signal 104 (e.g., as indicated by the detected bandwidth signal 106). In some cases, the amplifier control system 672 receives the slew rate control signal and controls the supply voltages $V_{dd\_h1}$, $V_{dd\_h2}$ and $V_{dd\_h3}$ provided to each amplifying stage. In some examples, the slew rate control signal may be generated by the shaping and control circuit 164 or the signal bandwidth detection circuit 163. In some examples, the amplifier control signal 164b may comprise the slew rate control signal. Or in further embodiments, a portion of the detected bandwidth signal 106 may be provided to the EA 162 as the first slew rate switch 433.

As shown in FIG. 10, the primary amplifying stage 670 of the differential amplification circuit includes p-type field-effect transistors (PFETs) 601, 611, 612, 625, 626, 627 and 654. And n-type field-effect transistors (NFETs) 602, 613, 614, 621, 622, 623 and 652. The initial amplifying stage 670 includes a first input Vin_p and a second input Vin_n, which are of different input impedance. In particular, the first input Vin_p is connected to the buffer 604, which can include a transistor gate and/or other high input impedance elements. In contrast, the second input Vin_n connects to sources of PFET 601 and NFET 602 and drains of NFET 622 and PFET 626 at a low impedance node $N_{LOW}$. The initial amplifying stage 670 further includes two bias current sources 661 and 662. Additionally, the differential amplification circuit 162 includes a buffer 604. As shown in FIG. 10, the buffer 604, the PFET 611, the PFET 612, the NFET 613, and the NFET 614 operate as a first input circuit 603. The buffer 604 includes a positive input of high impedance (for instance, a transistor gate), and a negative input of high impedance (for instance, a transistor gate).

The amplifying stage 680 of the differential amplification circuit includes p-type field-effect transistors (PFETs) 631, 636, 638, 643, 644, and 653 and n-type field-effect transistors (NFETs) 632, 635, 637, 641, 642, and 651. The amplifying stage 680 further includes two bias current sources 663 and 664, and a class AB bias circuit 666 and a class AB current source 668. The amplifying stage 680 receives input signals from the initial amplifying stage 670 via the junctions ltr1 in the initial amplification stage 670.

By implementing the second input Vin_n that receives the envelope signal 104 with low impedance, the second input Vin_n can source or sink a relatively large current to quickly charge or discharge internal capacitances of the differential amplification circuit 162 in response to changes in the envelope signal. Thus, high bandwidth is provided.

The primary amplifier 670 generates one or more output currents each provided to a subsequent amplifying stages. The amplifying stages that are activated by the amplifier control system 672, work in parallel to increase the drive and therefore the slew rate of the EA 162. In the example shown, the primary amplifying stage provides a current to the amplifying stage 680 and amplifying stage 690 via a first node LTR1 and a second node LTR2 respectively. When the amplifying stage 680 and the amplifying stage 690 are both activated, their outputs (OUT1 and OUT2) are combined in the output OUT 695 of the EA 162.

The amplification stage 680 generates an output signal (e.g., an output current) at an output OUT1 that is electrically connected to the output OUT 695 of the EA 162. Additionally, the amplification stage 680 operates with a class AB bias circuit 666 to provide a push-pull output stage for enhanced bandwidth.

The subsequent amplifying stage 690 may be identical to the amplifying stage 680 and, when activated, amplifies an output signal received from the primary amplifying stage 670 via the node LTR2 and generates an output signal (e.g., an output current) at an output OUT2 that is electrically connected to the output OUT 695 of the EA 162.

In some implementations, the EA 162 includes three or more amplifying stages that are individually controlled by the amplifier stage control system 672. In these implementations, the primary stage 670 includes more nodes similar to LTR1 and LTR2 that provide the input to the additional amplifying stages. The outputs of all amplifying stages are combined to generate output OUT 695 of the EA 162.

The differential amplification circuit 162 is also implemented to operate with relatively low swing of internal nodes, thus further providing fast transient response by reducing the amount of charging and discharging needed to respond to a change in the envelope signal.

With continuing reference to FIG. 10, the amplifying stage 670 and the amplifying stage 680 receive a bias voltages $V_{dd\_h1}$ and $V_{dd\_h2}$, for example, from the amplifier stage control system 672. By controlling the state of the $V_{dd\_h1}$ or $V_{dd\_h2}$ between ON and OFF states, the amplifier stage control system 672 may change the slew rate of the error amplifier circuit 162 by including or excluding one or more amplifying stages in the amplification process.

In various embodiments of error amplifier 162 with controllable slew rate described above, the shaping and control circuit 164 may be configured to change the slew rate of the EA (e.g., using the slew rate control signal) based on a comparison between the detected signal bandwidth (bandwidth of the envelope signal) and one or more slew rate control bandwidths. For example, when the detected signal bandwidth is below a first slew rate control bandwidth, the shaping and control circuit 164 may reduce the slew rate of the EA to a minimum slew rate (e.g., by including one amplifying stage or activating biasing stage). When the detected signal bandwidth is greater than the first slew rate control bandwidth, but smaller than a second slew rate control bandwidth, the shaping and control circuit 164 may increase the slew rate of the EA by including two amplifying stages or activating two biasing stages. When the detected signal bandwidth is greater than the second slew rate control bandwidth, but smaller than a third slew rate control bandwidth, the shaping and control circuit 164 may further increase the slew rate of the EA by including three amplifying stages or activating three biasing stages.

Figure 11:
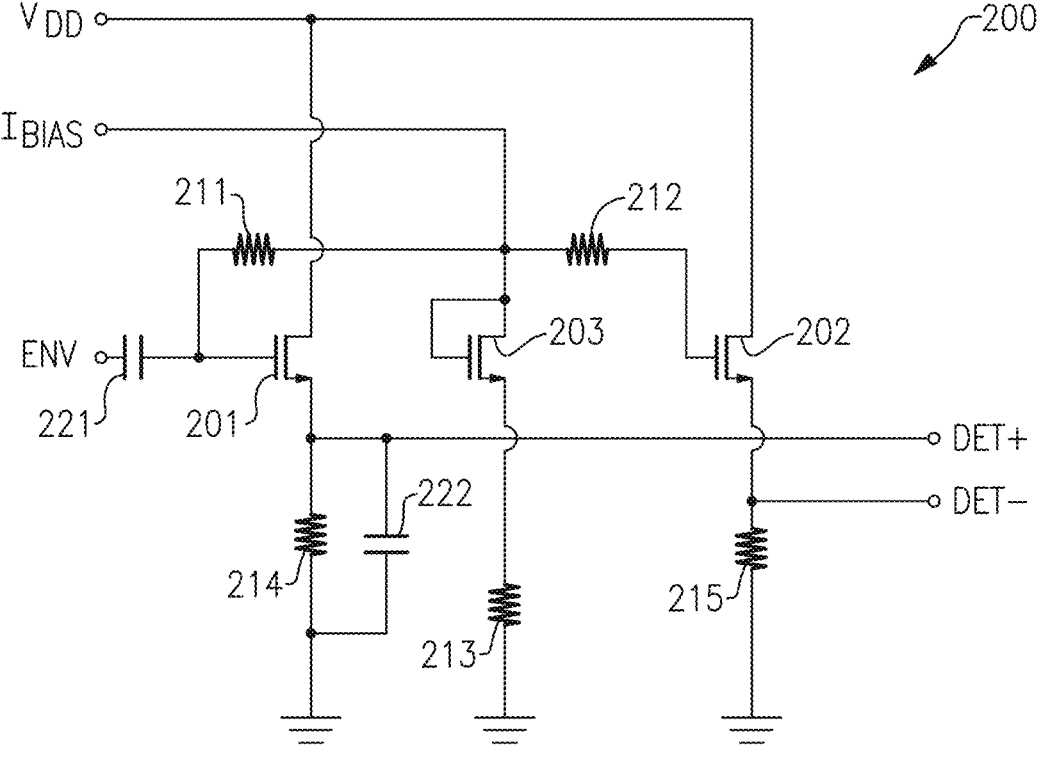
FIG. 11 is a schematic diagram of an RMS detector according to one embodiment.

FIG. 11 is a schematic diagram of a root mean square (RMS) detector 200 according to one embodiment.

The RMS detector 200 of FIG. 11 illustrates one implementation of the RMS detector 171 of FIG. 8A. However, the teachings herein are applicable signal bandwidth detection circuits implemented in a wide variety of ways. Accordingly, other implementations are possible.

With continuing reference to FIG. 11, the RMS detector 200 receives an envelope signal ENV, and processes the envelope signal to generate a differential detection signal corresponding to a difference between a non-inverted detection signal DET+ and an inverted detection signal DET−.

The RMS detector 200 includes a first detection n-type field effect transistor (NFET) 201, a second detection NFET 202, a bias NFET 203, a first biasing resistor 211, a second biasing resistor 212, a third biasing resistor 213, a first detection resistor 214, a second detection resistor 215, an input capacitor 221, and a filter capacitor 222.

The input capacitor 221 couples the envelope signal ENV to a gate of the first detection NFET 201 while providing DC voltage blocking. The first biasing resistor 211 and the second biasing resistor 212 control the DC bias voltages of the first detection NFET 201 and the second detection NFET 202, respectively. The DC bias voltage level is based on a magnitude of a bias current provided through the bias NFET 203 and the third bias resistor 213.

The current through the first detection NFET 203 and the first detection resistor 214 changes in relation to the envelope signal ENV. Additionally, the filter capacitor 222 operates to filter the voltage across the first detection resistor 214. Thus, the non-inverted detection signal DET+ changes with the envelope signal ENV. The non-inverted detection signal DET+ also includes a DC component that is based on DC biasing, including for example, a magnitude of the bias current Ibias. To compensate for DC biasing, the second detection NFET 202 the second detection resistor 215 are used to generate the inverted detection signal DET−, which has a DC component that tracks the DC component of the non-inverted detection signal.

By using differential signaling, a detection signal that changes with an RMS value of the envelope signal ENV is provided, while compensating or correction for a DC bias offset or error.

Figure 12A:
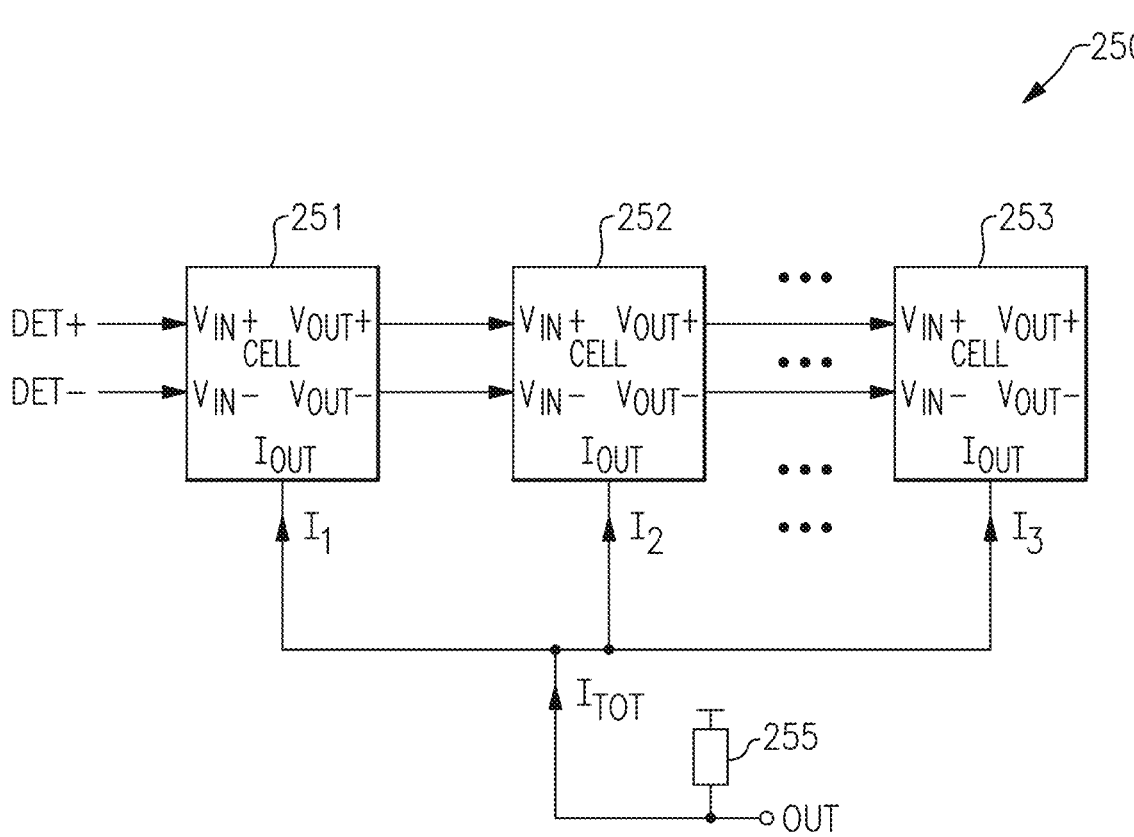
FIG. 12A is a schematic diagram of an envelope bandwidth-to-voltage converter according to one embodiment.

FIG. 12A is a schematic diagram of an envelope bandwidth to voltage converter 250 according to one embodiment.

The RMS detector 250 of FIG. 12A illustrates one implementation of the envelope bandwidth to voltage converter 172 of FIG. 8A. However, the teachings herein are applicable signal bandwidth detection circuits implemented in a wide variety of ways. Accordingly, other implementations are possible.

The envelope bandwidth to voltage converter 250 is used to generate an output voltage OUT, which changes in relation to a bandwidth indicated by an input differential detection signal corresponding to a difference between a non-inverted RMS detection signal DET+ and an inverted RMS detection signal DET−.

The voltage converter 250 includes a first converter cell 251, a second converter cell 252, and a third converter cell 253 arranged in a cascade. Although the illustrated embodiment includes three converter cells, more or fewer converter cells can be included.

As shown in FIG. 12A, the first converter cell 251 generates a first current based on the input differential detection signal DET+, DET−. Additionally, the first converter cell 251 provides a first down-shifted detection signal to the second converter cell 252 based on down-shifting the voltage of the input detection signal DET+, DET−. The second converter cell 252 generates a second current $I_2$ based on the first down-shifted differential detection signal. The second converter cell 252 further provides a second down-shifted detection signal to the third converter cell 253 based on down-shifting the voltage of the first output detection signal. Furthermore, the third converter cell 253 generates a third current $I_3$ based on the second down-shifted detection signal. As shown in FIG. 11A, in the illustrated embodiment, the converter cells each include non-inverted input voltage VIN+, inverted input voltage VIN−, non-inverted output voltage VOUT+, inverted output voltage VOUT−, and output current Tout terminals.

As shown in FIG. 12A, the currents from the converter cells 251-253 are summed to generate a total current $I_{TOT}$ which flows through the impedance 255 to generate the output signal OUT. In certain implementations, the impedance 255 is connected to a positive reference voltage, such as a power high supply voltage.

Figure 12B:
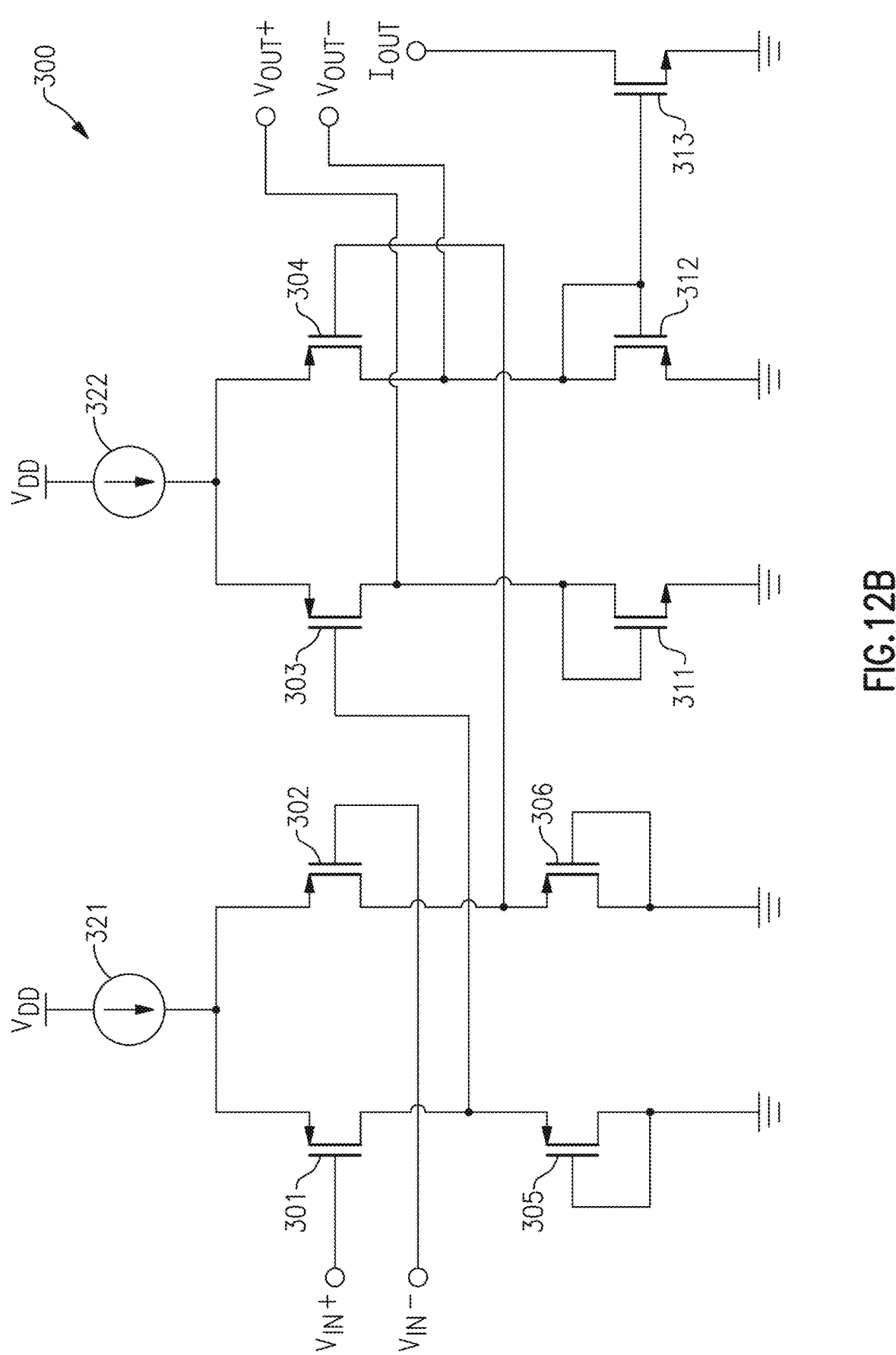
FIG. 12B is a schematic diagram of one embodiment of a converter cell for the envelope bandwidth to voltage converter of FIG. 12A.

FIG. 12B is a schematic diagram of one embodiment of a converter cell 300 for the envelope bandwidth to voltage converter 250 of FIG. 12A.

The converter cell 300 includes a first differential transistor pair including a first p-type field effect transistor (PFET) 301 and a second PFET 302, a second differential transistor pair including a third PFET 303 and a fourth PFET 304, and two bias current sources 321/322. The converter cell 300 further includes a first load transistor pair including a fifth PFET 305 and a sixth PFET 306, and a second load transistor pair including a first n-type NFET 311 and a second NFET 312. As shown in FIG. 12B, the first load transistor pair serves as a load to the first differential transistor pair, and the second load transistor pair serves as a load to the second differential transistor pair.

The first differential transistor pair 301-302 amplifies a voltage difference between the differential input signal IN+, IN−. Additionally, the amplified voltage difference provided by the first differential transistor pair 301-302 is further amplified by the second differential transistor pair 303-304 to generate a differential output signal VOUT+, VOUT−.

The current through the second NFET 312 is mirrored using the mirror NFET 313 to generate an output current Tout for the converter stage 300.

Figure 12C:
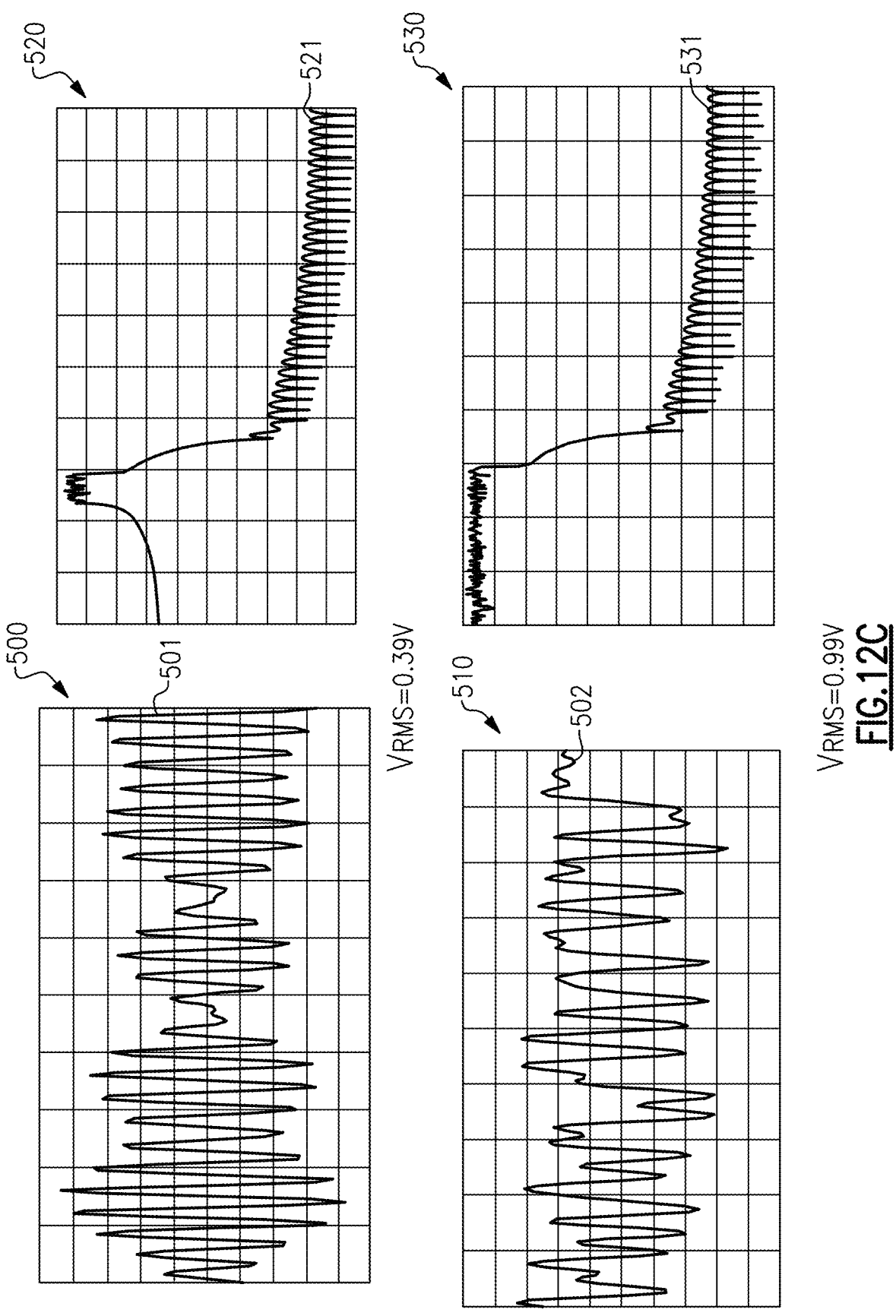
FIG. 12C illustrates one example of lab generated data for an envelope tracking system.

FIG. 12C illustrates one example of lab generated data for an envelope tracking system. The lab generated data includes a first graph 500, a second graph 510, a third graph 520 and a fourth graph 530.

The first graph 500 includes a first plot 501 of amplitude versus frequency for one example of a baseband signal occupying 1 resource block. The second graph 510 includes a second plot 502 of RF power versus frequency for the baseband signal of the first plot 501.

The third graph 520 includes a third plot 521 of amplitude versus frequency for another example of a baseband signal occupying 4 resource blocks. The fourth graph 530 includes a fourth plot 531 of RF power versus frequency for the baseband signal of the third plot 521.

The lab data also shows RMS voltages for the baseband signals occupying different numbers of resource blocks. As shown in FIG. 13C, the RMS voltage changes based on the number of resource blocks in the signal.

Although FIG. 12C illustrates one example of lab generated data, a signal can exhibit different characteristics depending on a wide variety of factors. Accordingly, other lab data is possible.

Figure 13A:
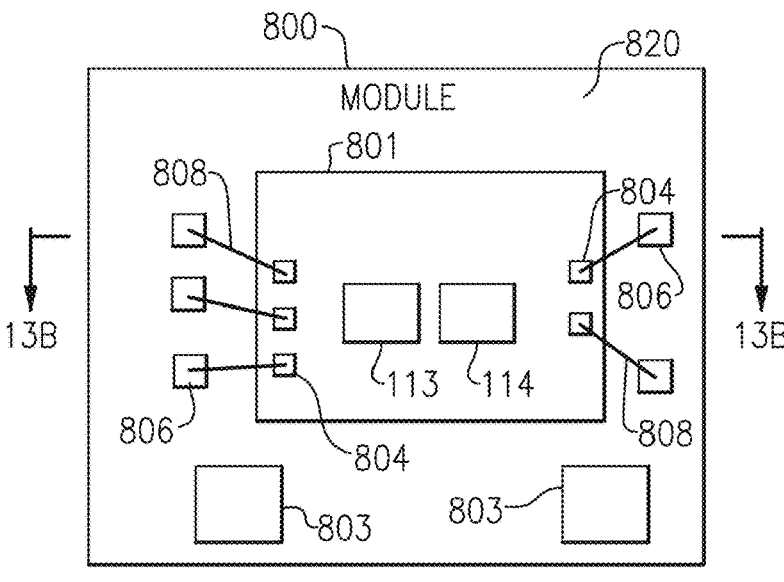
FIG. 13A is a schematic diagram of one embodiment of a packaged module.
Figure 13B:
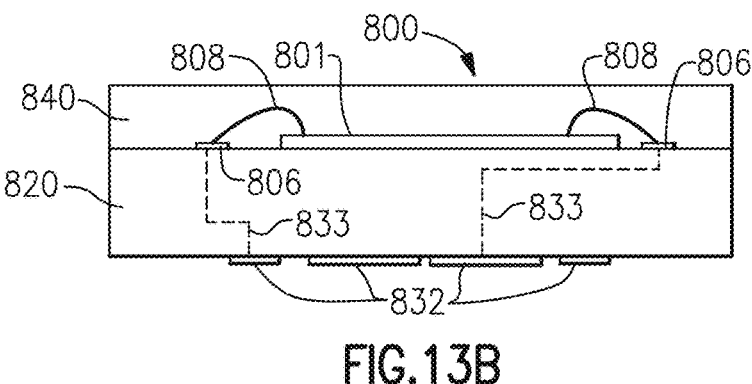
FIG. 13B is a schematic diagram of a cross-section of the packaged module of FIG. 13A taken along the lines 13B-13B.

FIG. 13A is a schematic diagram of one embodiment of a packaged module 800. FIG. 13B is a schematic diagram of a cross-section of the packaged module 800 of FIG. 13A taken along the lines 13B-13B.

The packaged module 800 includes an IC or die 801, surface mount components 803, wirebonds 808, a package substrate 820, and encapsulation structure 840. The package substrate 820 includes pads 806 formed from conductors disposed therein. Additionally, the die 801 includes pads 804, and the wirebonds 808 have been used to electrically connect the pads 804 of the die 801 to the pads 806 of the package substrate 801.

The die 801 includes a signal bandwidth detection circuit 163, and a mode control circuit 164, which can be as described earlier. In one embodiment, the die 301 further includes a power amplifier.

The packaging substrate 820 can be configured to receive a plurality of components such as the die 801 and the surface mount components 803, which can include, for example, surface mount capacitors and/or inductors.

As shown in FIG. 13B, the packaged module 800 is shown to include a plurality of contact pads 832 disposed on the side of the packaged module 800 opposite the side used to mount the die 801. Configuring the packaged module 800 in this manner can aid in connecting the packaged module 800 to a circuit board such as a phone board of a wireless device. The example contact pads 832 can be configured to provide RF signals, bias signals, power low voltage(s) and/or power high voltage(s) to the die 801 and/or the surface mount components 803. As shown in FIG. 13B, the electrically connections between the contact pads 832 and the die 801 can be facilitated by connections 833 through the package substrate 820. The connections 833 can represent electrical paths formed through the package substrate 820, such as connections associated with vias and conductors of a multilayer laminated package substrate.

In some embodiments, the packaged module 800 can also include one or more packaging structures to, for example, provide protection and/or facilitate handling of the packaged module 800. Such a packaging structure can include overmold or encapsulation structure 840 formed over the packaging substrate 820 and the components and die(s) disposed thereon.

It will be understood that although the packaged module 800 is described in the context of electrical connections based on wirebonds, one or more features of the present disclosure can also be implemented in other packaging configurations, including, for example, flip-chip configurations.

Figure 14:
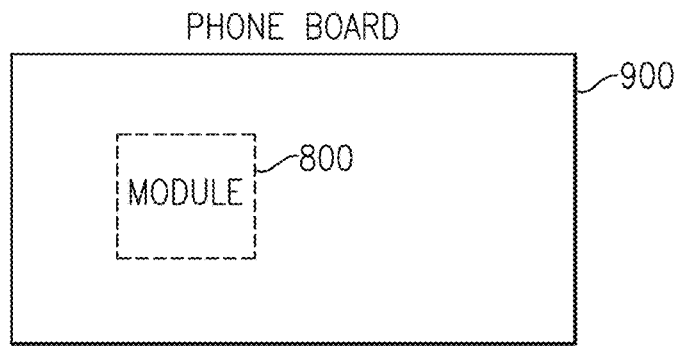
FIG. 14 is a schematic diagram of one embodiment of a phone board.

FIG. 14 is a schematic diagram of one embodiment of a phone board 900. The phone board 900 includes the module 800 shown in FIGS. 13A-13B attached thereto. Although not illustrated in FIG. 15 for clarity, the phone board 800 can include additional components and structures.

Applications

Some of the embodiments described above have provided examples in connection with wireless devices or mobile phones. However, the principles and advantages of the embodiments can be used for any other systems or apparatus that have needs for envelope trackers.

Such envelope trackers can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Terminology

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An envelope tracker for a power amplifier, the envelope tracker comprising:
   an input configured to receive an envelope signal corresponding to an envelope of a radio frequency signal;
   an error amplifier configured to generate a power amplifier supply voltage;
   a signal bandwidth detection circuit configured to generate a detected bandwidth signal indicating a bandwidth of the envelope signal; and
   a shaping and control circuit configured to control a slew rate of the error amplifier based on the detected bandwidth signal, the shaping and control circuit configured to control the slew rate of the error amplifier by adjusting a number of active amplifying stages of the error amplifier.

2. The envelope tracker of claim 1 wherein the shaping and control circuit is further configured to control a mode of the envelope tracker based on the detected bandwidth signal.

3. The envelope tracker of claim 1 wherein the shaping and control circuit is configured to process the detected bandwidth signal to determine a number of resource blocks used by the radio frequency signal, and to control the error amplifier based on the number of resource blocks.

4. The envelope tracker of claim 1 wherein the shaping and control circuit is configured to control the slew rate of the error amplifier by adjusting a bias current of the error amplifier.

5. The envelope tracker of claim 1 wherein the shaping and control circuit is configured to disable the error amplifier based on the detected bandwidth signal.

6. The envelope tracker of claim 1 wherein the shaping and control circuit is configured to decrease a bias current of the error amplifier based on the detected bandwidth signal.

7. The envelope tracker of claim 1 wherein the envelope tracker further includes a DC-to-DC converter, and the error amplifier and the DC-to-DC converter operate in parallel with one another to generate the power amplifier supply voltage when the detected bandwidth signal indicates the bandwidth of the envelope signal satisfies a condition.

8. An envelope tracker for a power amplifier, the envelope tracker comprising:
   an input configured to receive an envelope signal corresponding to an envelope of a radio frequency signal;
   an error amplifier configured to generate a power amplifier supply voltage;
   a signal bandwidth detection circuit configured to generate a detected bandwidth signal indicating a bandwidth of the envelope signal; and
   a shaping and control circuit configured to control a slew rate of the error amplifier based on the detected bandwidth signal, the shaping and control circuit configured to control the slew rate of the error amplifier by controlling a number of active biasing stages of the error amplifier.

9. The envelope tracker of claim 8 wherein the shaping and control circuit is further configured to control a mode of the envelope tracker based on the detected bandwidth signal.

10. The envelope tracker of claim 8 wherein the shaping and control circuit is configured to control the slew rate of the error amplifier by adjusting a bias current of the error amplifier.

11. The envelope tracker of claim 8 wherein the envelope tracker further includes a DC-to-DC converter, and the error amplifier and the DC-to-DC converter operate in parallel with one another to generate the power amplifier supply voltage when the detected bandwidth signal indicates the bandwidth of the envelope signal satisfies a condition.

12. A power amplifier system comprising:
   a power amplifier configured to amplify a radio frequency signal and to receive power from a power amplifier supply voltage; and
   an envelope tracker configured to generate the power amplifier supply voltage based on an envelope signal corresponding to an envelope of the radio frequency signal, the envelope tracker including an error amplifier, a signal bandwidth detection circuit configured to generate a detected bandwidth signal indicating a bandwidth of the envelope signal, and a shaping and control circuit, the shaping and control circuit configured to control a slew rate of the error amplifier based on the detected bandwidth signal, the shaping and control circuit configured to control the slew rate of the error amplifier by controlling a number of active biasing stages of the error amplifier.

13. The power amplifier system of claim 12 wherein the shaping and control circuit is further configured to control a mode of the envelope tracker based on the detected bandwidth signal.

14. The power amplifier system of claim 12 wherein the shaping and control circuit is configured to process the detected bandwidth signal to determine a number of resource blocks used by the radio frequency signal, and to control the error amplifier based on the number of resource blocks.

15. A power amplifier system comprising:

a power amplifier configured to amplify a radio frequency signal and to receive power from a power amplifier supply voltage; and an envelope tracker configured to generate the power amplifier supply voltage based on an envelope signal corresponding to an envelope of the radio frequency signal, the envelope tracker including an error amplifier, a signal bandwidth detection circuit configured to generate a detected bandwidth signal indicating a bandwidth of the envelope signal, and a shaping and control circuit, the shaping and control circuit configured to control a slew rate of the error amplifier based on the detected bandwidth signal, the shaping and control circuit configured to control the slew rate of the error amplifier by adjusting a number of active amplifying stages of the error amplifier.

16. The power amplifier system of claim 12 wherein the shaping and control circuit includes a mode control circuit configured to disable the error amplifier based on the detected bandwidth signal.

17. The power amplifier system of claim 12 wherein the envelope tracker further includes a DC-to-DC converter, and the error amplifier and the DC-to-DC converter operate in parallel with one another to generate the power amplifier supply voltage when the detected bandwidth signal indicates the bandwidth of the envelope signal is greater than a second threshold bandwidth.

18. A mobile device comprising:

a power amplifier configured to amplify a radio frequency signal and to receive power from a power amplifier supply voltage;

an envelope tracker configured to generate the power amplifier supply voltage based on an envelope signal corresponding to an envelope of the radio frequency signal, the envelope tracker including an error amplifier, a signal bandwidth detection circuit configured to generate a detected bandwidth signal indicating a bandwidth of the envelope signal, and a shaping and control circuit, the shaping and control circuit configured to control a slew rate of the error amplifier based on the detected bandwidth signal; and an antenna configured to transmit the radio frequency signal amplified by the power amplifier, the shaping and control circuit configured to control the slew rate of the error amplifier by adjusting a number of active amplifying stages of the error amplifier.

19. The mobile device of claim 18 wherein the shaping and control circuit is further configured to control a mode of the envelope tracker based on the detected bandwidth signal.

* * * * *